United States Patent
Xie et al.

(10) Patent No.: US 11,631,617 B2
(45) Date of Patent: Apr. 18, 2023

(54) SCALABLE DEVICE FOR FINFET TECHNOLOGY

(71) Applicant: International Business Machines Corporation, Armonk, NY (US)

(72) Inventors: Ruilong Xie, Niskayuna, NY (US); Kangguo Cheng, Schenectady, NY (US); Juntao Li, Cohoes, NY (US); Chanro Park, Clifton Park, NY (US)

(73) Assignee: International Business Machines Corporation, Armonk, NY (US)

( * ) Notice: Subject to any disclaimer, the term of this patent is extended or adjusted under 35 U.S.C. 154(b) by 7 days.

(21) Appl. No.: 17/501,924

(22) Filed: Oct. 14, 2021

(65) Prior Publication Data

US 2022/0037212 A1   Feb. 3, 2022

Related U.S. Application Data

(62) Division of application No. 16/743,980, filed on Jan. 15, 2020, now Pat. No. 11,177,181.

(51) Int. Cl.
*H01L 21/8238*  (2006.01)
*H01L 29/417*  (2006.01)
(Continued)

(52) U.S. Cl.
CPC ........ *H01L 21/823821* (2013.01); *H01L 21/31056* (2013.01); *H01L 27/0924* (2013.01);
(Continued)

(58) Field of Classification Search
CPC .......... H01L 29/41791; H01L 27/0924; H01L 29/785; H01L 29/66795; H01L 21/823821; H01L 21/31056
See application file for complete search history.

(56) References Cited

U.S. PATENT DOCUMENTS 7,863,136 B2   1/2011   Goldbach et al.
9,076,766 B2   7/2015   Liu et al.
(Continued)

FOREIGN PATENT DOCUMENTS

EP   1923908 A2   5/2008

OTHER PUBLICATIONS

Rohit S. Shenoy, "Technology and Scaling of Ultrathin Body Double-Gate Fets" Dissertation, Stanford University (Dec. 2004) (190 pages).

(Continued)

*Primary Examiner* — Bac H Au
(74) *Attorney, Agent, or Firm* — Robert Sullivan; Michael J. Chang, LLC

(57) ABSTRACT

Scalable device designs for FINFET technology are provided. In one aspect, a method of forming a FINFET device includes: patterning fins in a substrate which include a first fin(s) corresponding to a first FINFET device and a second fin(s) corresponding to a second FINFET device; depositing a conformal gate dielectric over the fins; depositing a conformal sacrificial layer over the gate dielectric; depositing a sacrificial gate material over the sacrificial layer; replacing the sacrificial layer with a first workfunction-setting metal(s) over the first fin(s) and a second workfunction-setting metal(s) over the second fin(s); removing the sacrificial gate material; forming dielectric gates over the first workfunction-setting metal(s), the second workfunction-setting metal(s) and the gate dielectric forming gate stacks; and forming source and drains in the fins between the gate stacks, wherein the source and drains are separated from the gate stacks by inner spacers. A FINFET device is also provided.

20 Claims, 26 Drawing Sheets

(51) Int. Cl.
    *H01L 27/092*     (2006.01)
    *H01L 29/78*     (2006.01)
    *H01L 21/3105*     (2006.01)
    *H01L 29/66*     (2006.01)

(52) U.S. Cl.
    CPC .. *H01L 29/41791* (2013.01); *H01L 29/66795* (2013.01); *H01L 29/785* (2013.01)

(56) References Cited

U.S. PATENT DOCUMENTS

| | | |
|---|---|---|
| 9,812,365 B1 | 11/2017 | Zhang et al. |
| 9,837,277 B2 | 12/2017 | Cheng et al. |
| 9,929,157 B1 | 3/2018 | Xie et al. |
| 10,068,987 B1 | 9/2018 | Zang |
| 10,236,219 B1 | 3/2019 | Anderson et al. |
| 10,510,620 B1 | 12/2019 | Chanemougame et al. |
| 10,777,463 B2 | 9/2020 | Gu et al. |
| 2014/0217482 A1 | 8/2014 | Xie et al. |
| 2017/0053836 A1 | 2/2017 | Park et al. |
| 2018/0006118 A1 | 1/2018 | Mallela et al. |
| 2018/0212029 A1 | 7/2018 | Xu et al. |
| 2018/0261514 A1 | 9/2018 | Xie et al. |
| 2019/0051733 A1 | 2/2019 | Zang |
| 2019/0067286 A1 | 2/2019 | Li |
| 2019/0067478 A1 | 2/2019 | Chu et al. |
| 2019/0123189 A1 | 4/2019 | Chen et al. |
| 2019/0164741 A1 | 5/2019 | Wen et al. |
| 2019/0259760 A1 | 8/2019 | Liao et al. |
| 2019/0334003 A1 | 10/2019 | Liang et al. |
| 2020/0035567 A1 | 1/2020 | Chanemougame |
| 2020/0105623 A1 | 4/2020 | Chu et al. |
| 2020/0119163 A1 | 4/2020 | Xie et al. |
| 2020/0152521 A1 | 5/2020 | Huang et al. |
| 2020/0279942 A1 | 9/2020 | Niimi et al. |
| 2021/0098602 A1 | 4/2021 | Xie et al. |
| 2021/0217667 A1 | 7/2021 | Xie et al. |

OTHER PUBLICATIONS

List of IBM Patents or Applications Treated as Related, Oct. 14, 2021 (2 pages).

SCALABLE DEVICE FOR FINFET TECHNOLOGY

FIELD OF THE INVENTION

The present invention relates to fin field-effect transistor (FINFET) devices, and more particularly, scalable device designs for FINFET technology.

BACKGROUND OF THE INVENTION

As fin field-effect transistor (FINFET) technology scales, both gate pitch and cell height become smaller and smaller which typically requires the use of fin pitch scaling or fin depopulation techniques. As the name implies, fin pitch scaling involves reducing the fin pitch thereby increasing the density of fins in a given area of the device. However, increasing the fin pitch presents a lot of patterning and process challenges.

Fin depopulation, on the other hand, reduces the number of FINFETs per cell and relaxes the fin pitch. However, in order to meet performance requirements, the fin height needs to be increased. A taller fin requires a correspondingly taller gate which undesirably leads to a lot of parasitic capacitance.

Thus, improved FINFET designs and techniques for fabrication thereof would be desirable.

SUMMARY OF THE INVENTION

The present invention provides scalable device designs for fin field-effect transistor (FINFET) technology. In one aspect of the invention, a method of forming a FINFET device is provided. The method includes: patterning fins in a substrate, wherein the fins include at least one first fin corresponding to a first FINFET device and at least one second fin corresponding to a second FINFET device; depositing a conformal gate dielectric over the fins; depositing a conformal sacrificial layer over the conformal gate dielectric; depositing a sacrificial gate material over the conformal sacrificial layer; replacing the conformal sacrificial layer with at least one first workfunction-setting metal over the at least one first fin and at least one second workfunction-setting metal over the at least one second fin; removing the sacrificial gate material; forming dielectric gates over the at least one first workfunction-setting metal, the at least one second workfunction-setting metal and the conformal gate dielectric forming gate stacks of the first FINFET device and the second FINFET device; and forming source and drains in the fins between the gate stacks, wherein the source and drains are separated from the gate stacks by inner spacers.

In another aspect of the invention, another method of forming a FINFET device is provided. The method includes: patterning fins in a substrate, wherein the fins include at least one first fin corresponding to a first FINFET device and at least one second fin corresponding to a second FINFET device; depositing a conformal gate dielectric over the fins; depositing a conformal sacrificial layer over the conformal gate dielectric; depositing a sacrificial gate material over the conformal sacrificial layer; selectively removing the conformal sacrificial layer from the first FINFET device forming a first cavity over the at least one first fin; depositing at least one first workfunction-setting metal into the first cavity; selectively removing the conformal sacrificial layer from the second FINFET device forming a second cavity over the at least one second fin; depositing at least one second workfunction-setting metal into the second cavity; removing the sacrificial gate material; forming dielectric gates over the at least one first workfunction-setting metal, the at least one second workfunction-setting metal and the conformal gate dielectric forming gate stacks of the first FINFET device and the second FINFET device; recessing the conformal gate dielectric, the at least one first workfunction-setting metal and the at least one second workfunction-setting metal beneath the dielectric gates, forming divots; forming inner spacers in the divots; and forming source and drains in the fins between the gate stacks, wherein the source and drains are separated from the gate stacks by the inner spacers.

In yet another aspect of the invention, a FINFET device is provided. The FINFET device includes: fins patterned in a substrate, wherein the fins include at least one first fin corresponding to a first FINFET device and at least one second fin corresponding to a second FINFET device; a conformal gate dielectric disposed over the fins; at least one first workfunction-setting metal disposed over the at least one first fin and at least one second workfunction-setting metal disposed over the at least one second fin, wherein the at least one first workfunction-setting metal and the at least one second workfunction-setting metal have the same thickness T; dielectric gates formed over the at least one first workfunction-setting metal, the at least one second workfunction-setting metal and the conformal gate dielectric forming gate stacks of the first FINFET device and the second FINFET device; and source and drains formed in the fins between the gate stacks, wherein the source and drains are separated from the gate stacks by inner spacers.

A more complete understanding of the present invention, as well as further features and advantages of the present invention, will be obtained by reference to the following detailed description and drawings.

DETAILED DESCRIPTION OF PREFERRED EMBODIMENTS

Provided herein are fin field-effect transistor (FINFET) devices and techniques for formation thereof that employ a dielectric gate and a workfunction-setting liner that wraps around the fins under the dielectric gate. An inner spacer under the dielectric gate separates the gate stack from the source and drains. Advantageously, the present FINFET device design minimizes capacitance and provides better dimension control for gate length, all by using easily implemented fabrication processes.

Figure 1:
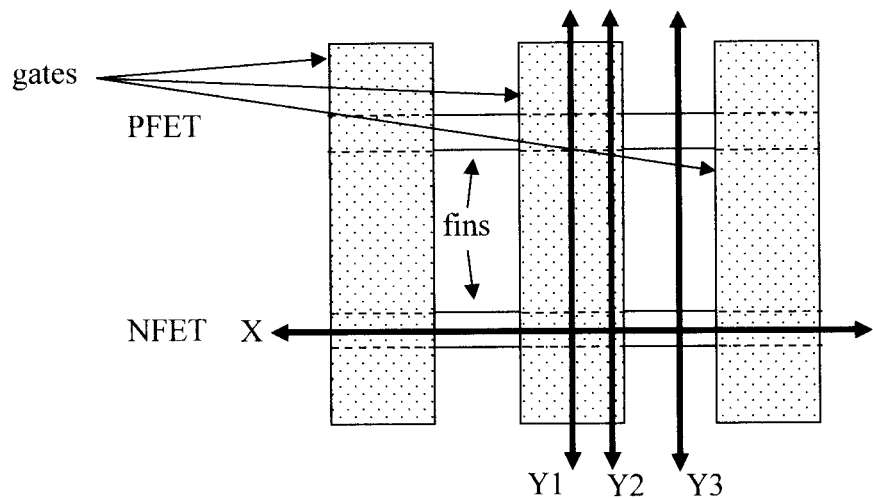
FIG. 1 is a top-down view of the general FINFET design presented herein according to an embodiment of the present invention.

An exemplary methodology for forming a FINFET device in accordance with the present techniques is now described by way of reference to FIGS. 1-19. In each of the figures that follows, a cross-sectional view through a part of the FINFET device will be depicted. See, for example, FIG. 1 which is a top-down view of the general FINFET device design showing the orientations of the various cuts through the device that will be depicted in the figures. As shown in FIG. 1, the FINFET device generally includes at least one p-channel FET fin and at least one n-channel FET fin, labeled "PFET" and "NFET," respectively. The gates of the FINFET device are oriented orthogonal to the PFET and NFET fins. In FIG. 1, the sacrificial gates are shown. As will be described in detail below, the sacrificial gates are later replaced with the dielectric gates. However, the orientation of the gates vis-à-vis the PFET and NFET fins is the same for the sacrificial and dielectric gates.

As shown in FIG. 1, in one cross-sectional view X, cuts through the center of one of the fins (parallel to the fins and perpendicular to the gates) will be provided. A cross-sectional view Y1 of cuts through the PFET and NFET fins (perpendicular to the fins and through the center of one of the gates) will also be provided, as will a cross-sectional view Y2 of cuts through the PFET and NFET fins (perpendicular to the fins and through the edge of one of the gates), and a cross-sectional view Y3 of cuts through the PFET and NFET fins (perpendicular to the fins and in between two of the gates and outside of the gate region of the FINFET device).

Figure 2A:
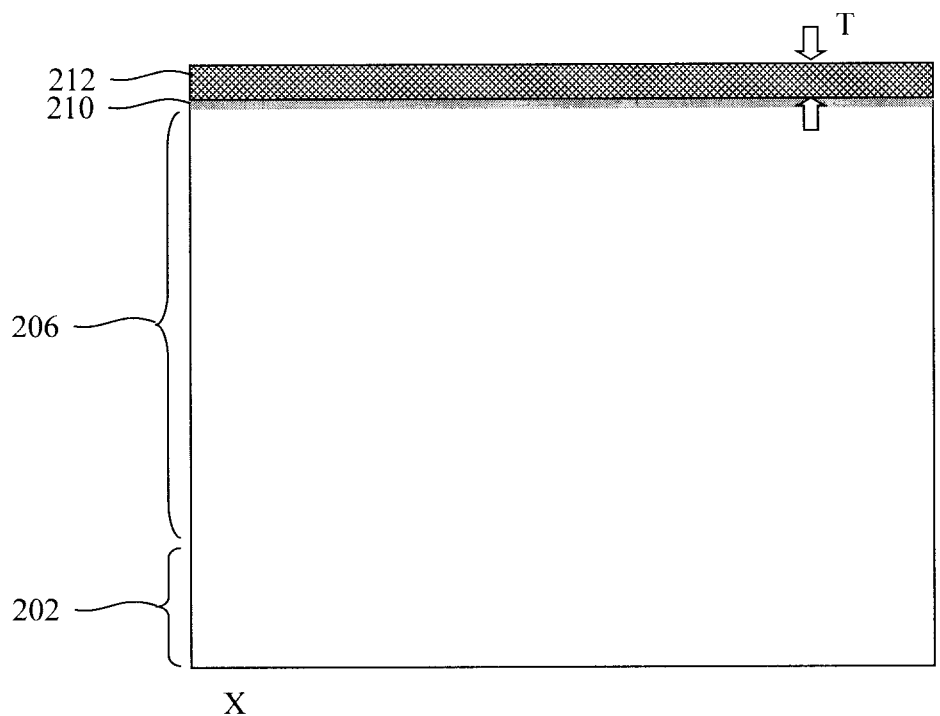
FIG. 2A is a diagram illustrating a fin having been patterned in a substrate, a high-κ gate dielectric having been deposited onto the fin, and a sacrificial layer having been deposited over the high-κ gate dielectric from a cross-sectional view parallel to one of the fins.
Figure 2B:
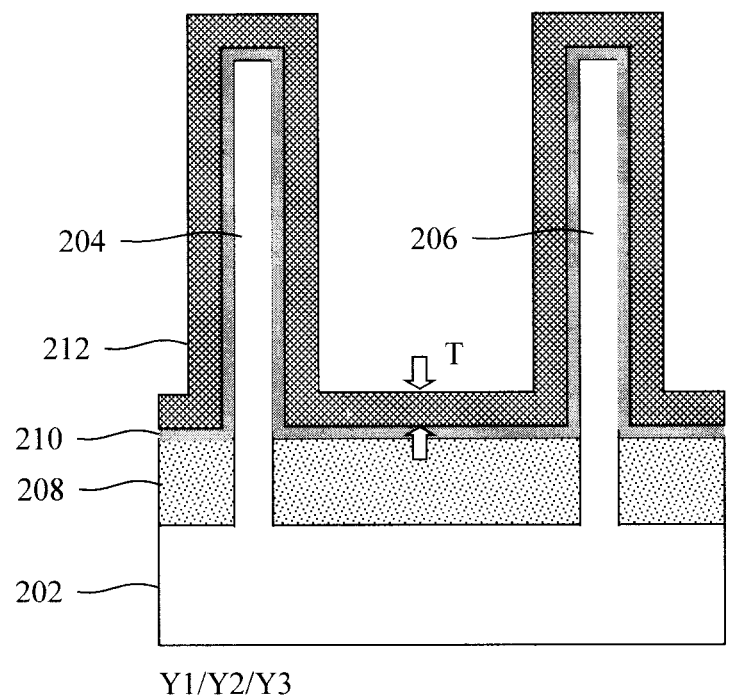
FIG. 2B is a diagram illustrating (NFET and PFET) fins patterned in the substrate, STI regions having been formed in between the fins, the high-κ gate dielectric disposed on the fins, and the sacrificial layer disposed over the high-κ gate dielectric from cross-sectional views perpendicular to the fins according to an embodiment of the present invention.

The process begins with the patterning of fins 204 and 206 in a substrate 202. See FIGS. 2A and 2B. FIG. 2A provides a cross-sectional view X (see FIG. 1) through the device structure. At this point in the process, cross-sectional views Y1/Y2/Y3 (see FIG. 1) of the device structure all appear the same, see FIG. 2B. As highlighted above, these fins 204 and 206 will serve as the basis for forming at least a first FINFET device (e.g., an NFET device) and a second FINFET device (e.g., a PFET device), respectively. Thus, fins 204 and fins 206 may also be referred to herein as NFET and PFET fins, respectively. Further, for ease and clarity of depiction, a single NFET fin 204 and a single PFET fin 206 are depicted. However, it is noted that this is merely an example, and embodiments are contemplated herein where the number of PFET fins and/or NFET fins differs from what is shown in the figures. For instance, by way of example only, in one exemplary embodiment, multiple NFET fins 204 and/or multiple PFET fins 206 are formed in substrate 202.

According to an exemplary embodiment, substrate 202 is a bulk semiconductor wafer, such as a bulk silicon (Si), bulk germanium (Ge), bulk silicon germanium (SiGe) and/or bulk III-V semiconductor wafer. Alternatively, substrate 202 can be a semiconductor-on-insulator (SOI) wafer. A SOI wafer includes a SOI layer separated from an underlying substrate by a buried insulator. When the buried insulator is an oxide it is referred to herein as a buried oxide or BOX. The SOI layer can include any suitable semiconductor, such as Si, Ge, SiGe, and/or a III-V semiconductor. Substrate 202 may already have pre-built structures (not shown) such as transistors, diodes, capacitors, resistors, isolation regions (e.g., shallow trench isolation (STI) regions), interconnects, wiring, etc.

Standard lithography and etching processes can be employed to pattern the NFET fins 204 and PFET fins 206 in substrate 202, with a directional (anisotropic) etching process such as reactive ion etching (RIE) for the fin etch. Alternatively, the NFET fin(s) 204 and PFET fin(s) 206 can be formed in substrate 202 by other suitable techniques, including but not limited to, sidewall image transfer (SIT), self-aligned double patterning (SADP), self-aligned quadruple patterning (SAQP), and other self-aligned multiple patterning (SAMP). As-patterned, the NFET fin(s) 204 and PFET fin(s) 206 extend partway through the substrate 202.

Shallow trench isolation (STI) regions 208 are next formed on substrate 202 in between the NFET and PFET fins 204 and 206. According to an exemplary embodiment, STI regions 208 are formed from an oxide material (also referred to herein as an "STI oxide") such as silicon oxide (SiOx). Although not explicitly shown in the figures, a liner (e.g., a thermal oxide or silicon nitride (SiN)) may be deposited prior to the STI oxide.

A conformal high-κ gate dielectric 210 is then deposited onto the NFET and PFET fins 204 and 206 and STI regions 208. The term "high-κ," as used herein, refers to a material having a relative dielectric constant κ which is much higher than that of silicon dioxide (e.g., a dielectric constant κ=25 for hafnium oxide ($HfO_2$) rather than 4 for $SiO_2$). Suitable high-κ gate dielectrics include, but are not limited to, $HfO_2$ and/or lanthanum oxide ($La_2O_3$). A process such as chemical vapor deposition (CVD), atomic layer deposition (ALD) or physical vapor deposition (PVD) can be employed to deposit high-κ gate dielectric 210. According to an exemplary embodiment, high-κ gate dielectric 210 has a thickness of from about 1 nanometer (nm) to about 5 nm and ranges therebetween. A reliability anneal can be performed following deposition of high-κ gate dielectric 210. In one embodiment, the reliability anneal is performed at a temperature of from about 500° C. to about 1200° C. and ranges therebetween, for a duration of from about 1 nanosecond to about 30 seconds and ranges therebetween. Preferably, the reliability anneal is performed in the presence of an inert gas such as a nitrogen-containing ambient.

A conformal sacrificial layer 212 is then deposited onto the NFET and PFET fins 204 and 206 and STI regions 208 over the high-κ gate dielectric 210. The term "sacrificial," as used herein, refers to a material that serves as a placeholder during the fabrication process, which is later removed (in whole or in part) and replaced with another material (in this case the PFET/NFET workfunction-setting metals). Suitable materials for sacrificial layer 212 include, but are not limited to, titanium (Ti), titanium nitride (TiN), tantalum (Ta) and/or tantalum nitride (TaN). A process such as CVD, ALD or PVD can be employed to deposit sacrificial layer 212. According to an exemplary embodiment, sacrificial layer 212 has a thickness T of from about 3 nm to about 10 nm and ranges therebetween.

Figure 3A:
FIG. 3A is a diagram illustrating a hardmask layer having been deposited onto the sacrificial layer from a cross-sectional view parallel to one of the fins.
Figure 3B:
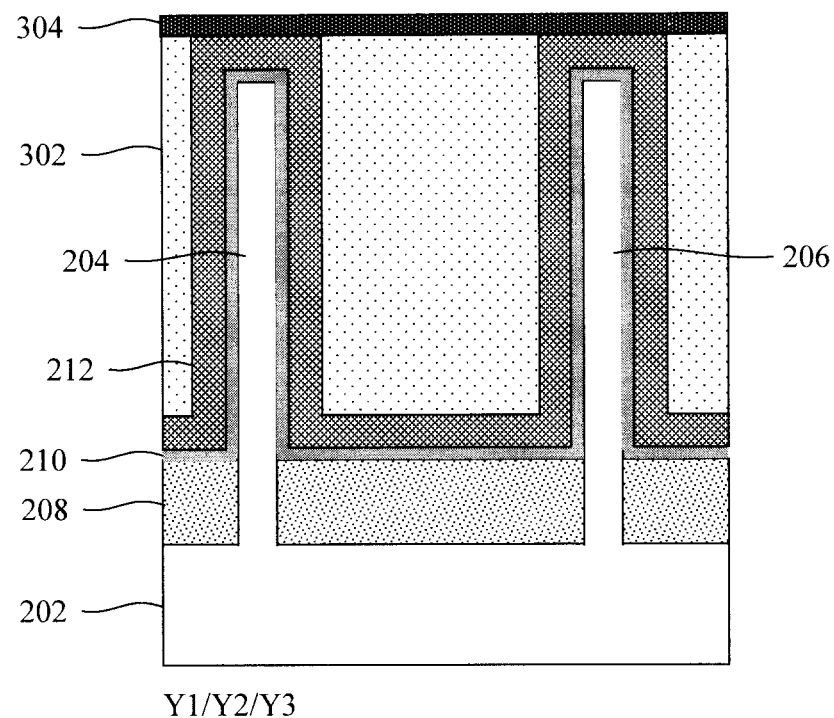
FIG. 3B is a diagram illustrating a sacrificial gate material having been deposited over the sacrificial layer, and the hardmask layer having been deposited onto the sacrificial gate material and sacrificial layer from cross-sectional views perpendicular to the fins according to an embodiment of the present invention.

The NFET and PFET fins 204 and 206 are then buried in a sacrificial gate material 302 which is then polished down to the sacrificial layer 212 at the tops of the NFET and PFET fins 204 and 206. See FIGS. 3A and 3B. FIG. 3A provides a cross-sectional view X (see FIG. 1) through the device structure. At this point in the process, cross-sectional views Y1/Y2/Y3 (see FIG. 1) of the device structure all appear the same, see FIG. 3B. Suitable sacrificial gate materials include, but are not limited to, poly-silicon (poly-Si) and/or amorphous silicon (a-Si). A process such as CVD, ALD or PVD can be used to deposit the sacrificial gate material 302 onto the NFET and PFET fins 204 and 206 over the sacrificial layer 212. Following deposition, the sacrificial gate material 302 is polished down to the sacrificial layer 212 at the tops of the NFET and PFET fins 204 and 206 using a process such as chemical-mechanical polishing (CMP). It is notable that, based on the polishing, the sacrificial gate material 302 is no longer visible in the cross-sectional view X shown in FIG. 3A.

A hardmask layer 304 is then deposited onto sacrificial gate material 302 and sacrificial layer 212. Suitable materials for hardmask layer 304 include, but are not limited to, nitride hardmask materials such as silicon nitride (SiN), silicon oxynitride (SiON), silicon carbide nitride (SiCN), and/or oxide hardmask materials such as silicon oxide (SiOx). A process such as CVD, ALD or PVD can be used to deposit hardmask layer 304. According to an exemplary embodiment, hardmask layer 304 has a thickness of from about 2 nm to about 5 nm and ranges therebetween. Patterning of the hardmask layer 304 is then used to permit the selective removal of sacrificial layer 212 in turn from the NFET and PFET fins 204 and 206, and replacement of the sacrificial layer 212 with the respective workfunction-setting metals.

Figure 4A:
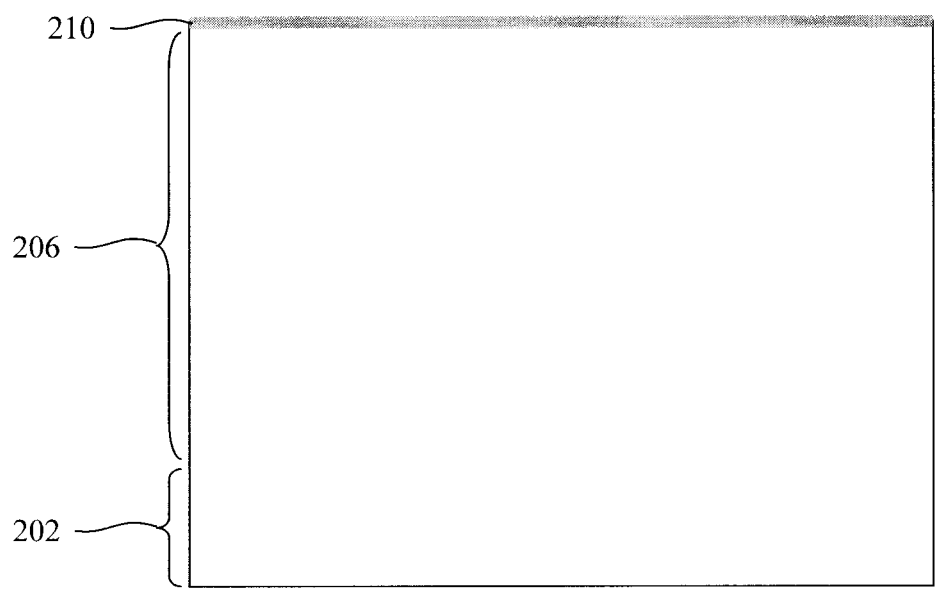
FIG. 4A is a diagram illustrating the hardmask layer having been opened over the PFET fin(s) and used to remove the sacrificial layer from the NFET fin(s) from a cross-sectional view parallel to one of the fins.

According to an exemplary embodiment, a block mask 402 is formed on the hardmask layer 304 over either the NFET fin(s) 204 or the PFET fin(s) 206. See FIGS. 4A and 4B. FIG. 4A provides a cross-sectional view X (see FIG. 1) through the device structure. At this point in the process, cross-sectional views Y1/Y2/Y3 (see FIG. 1) of the device structure all appear the same, see FIG. 4B. In the instant example, block mask 402 covers the sacrificial layer 212 over the PFET fin(s) 206. However, the choice to process the NFET fin(s) 204 before the PFET fin(s) 206 (or vice versa) is completely arbitrary. Suitable materials for block mask 402 include, but are not limited to, an organic planarizing layer (OPL) material, which can be deposited onto the hardmask layer 304 using a casting process such as spin-coating or spray casting.

Figure 4B:
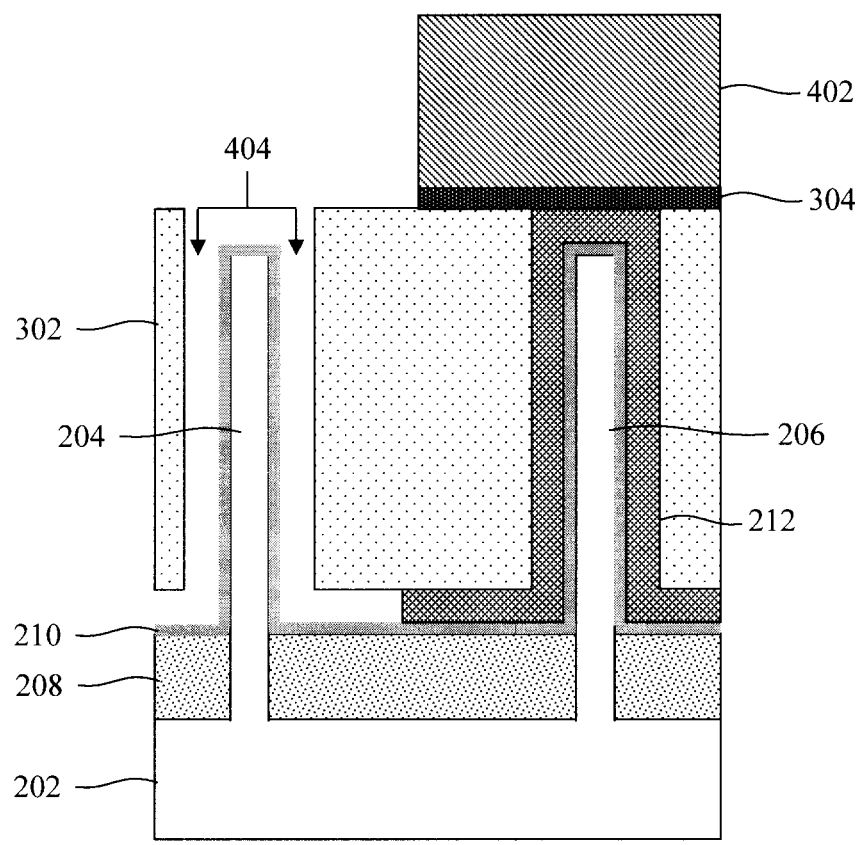
FIG. 4B is a diagram illustrating a block mask having been formed on the hardmask layer over the PFET fin(s), the hardmask layer having been opened over the NFET fin(s), and the sacrificial layer having been removed from the NFET fin(s) forming a first cavity from cross-sectional views perpendicular to the fins according to an embodiment of the present invention.

An etch using block mask 402 is then employed to open the hardmask layer 304 over NFET fin(s) 204. Again, the choice to process the NFET fin(s) 204 before the PFET fin(s) 206 (or vice versa) is completely arbitrary. The etch of hardmask layer 304 can be performed using a directional (anisotropic) etching process such as RIE to remove the hardmask layer 304 from over the NFET fin(s) 204. Doing so exposes the sacrificial layer 212 over the NFET fin(s) 204 which, as shown in FIGS. 4A and 4B, is then selectively removed. Selective removal of the sacrificial layer 212 forms a (first) cavity 404 over the NFET fin(s) 204.

According to an exemplary embodiment, the sacrificial layer 212 is removed from the NFET fin(s) 204 using a non-directional (isotropic) etching process such as a wet chemical etch. For instance, as provided above, sacrificial layer 212 can be formed from a metal nitride such as TiN and/or TaN. In that case, a selective TiN (or TaN) wet chemical etchant can be employed to remove sacrificial layer 212 selective to the high-κ gate dielectric 210 and sacrificial gate material 302. Since the etch is performed over only the NFET fin(s) 204 (i.e., the PFET fin(s) 206 remain blocked by hardmask layer 304 and block mask 402), the sacrificial layer 212 will remain intact over the PFET fin(s) 206.

Following removal of sacrificial layer 212 from the NFET fin(s) 204, the block mask 402 is removed. As provided above, block mask 402 can be formed from an OPL material. In that case, a process such as plasma ashing can be employed to remove the block mask 402.

Figure 5A:
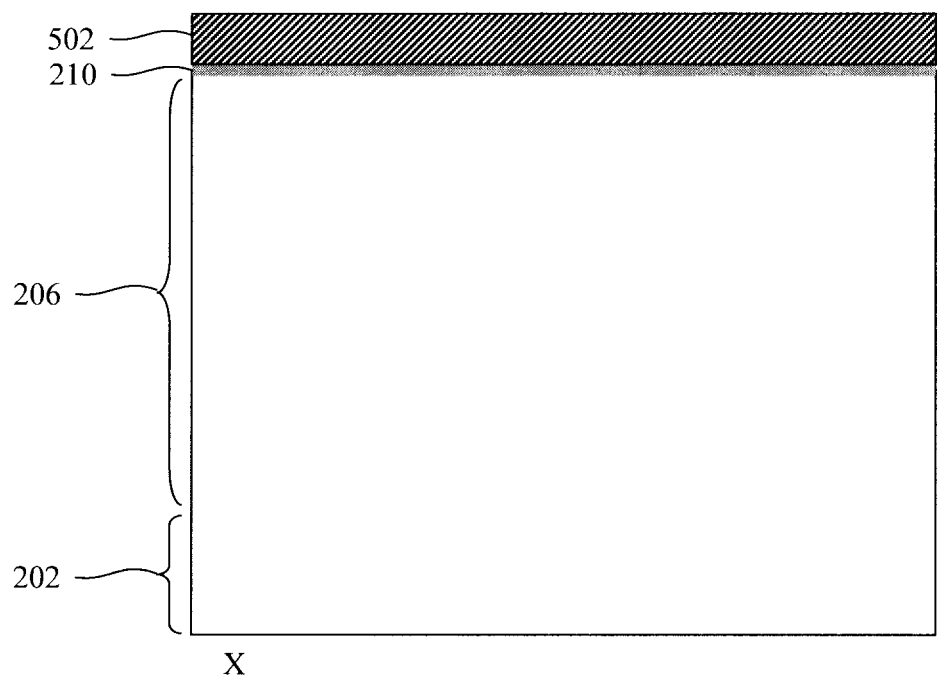
FIG. 5A is a diagram illustrating a first workfunction-setting metal having been deposited onto the NFET fin(s) over the high-κ gate dielectric from a cross-sectional view parallel to one of the fins.

A first workfunction-setting metal 502 is then deposited into and filling cavity 404. See FIGS. 5A and 5B. FIG. 5A provides a cross-sectional view X (see FIG. 1) through the device structure. At this point in the process, cross-sectional views Y1/Y2/Y3 (see FIG. 1) of the device structure all appear the same, see FIG. 5B. In this particular example, cavity 404 is present over the NFET fin(s) 204 and the first workfunction-setting metal 502 deposited into cavity 404 is an n-type workfunction-setting metal. As will be described in detail below, the process will then be repeated to deposit a p-type workfunction-setting metal selectively over the PFET fin(s) 206.

Suitable n-type workfunction-setting metals include, but are not limited to, titanium nitride (TiN), tantalum nitride (TaN) and/or aluminum (Al)—containing alloys such as titanium aluminide (TiAl), titanium aluminum nitride (TiAlN), titanium aluminum carbide (TiAlC), tantalum aluminide (TaAl), tantalum aluminum nitride (TaAlN), and/or tantalum aluminum carbide (TaAlC). Suitable p-type workfunction-setting metals include, but are not limited to, TiN, TaN, and/or tungsten (W). TiN and TaN are relatively thick (e.g., greater than about 2 nm) when used as p-type workfunction-setting metals. However, very thin TiN or TaN layers (e.g., less than about 2 nm) may also be used beneath Al-containing alloys in n-type workfunction-setting stacks to improve electrical properties such as gate leakage currents. Thus, there is some overlap in the exemplary n- and p-type workfunction-setting metals given above.

Figure 5B:
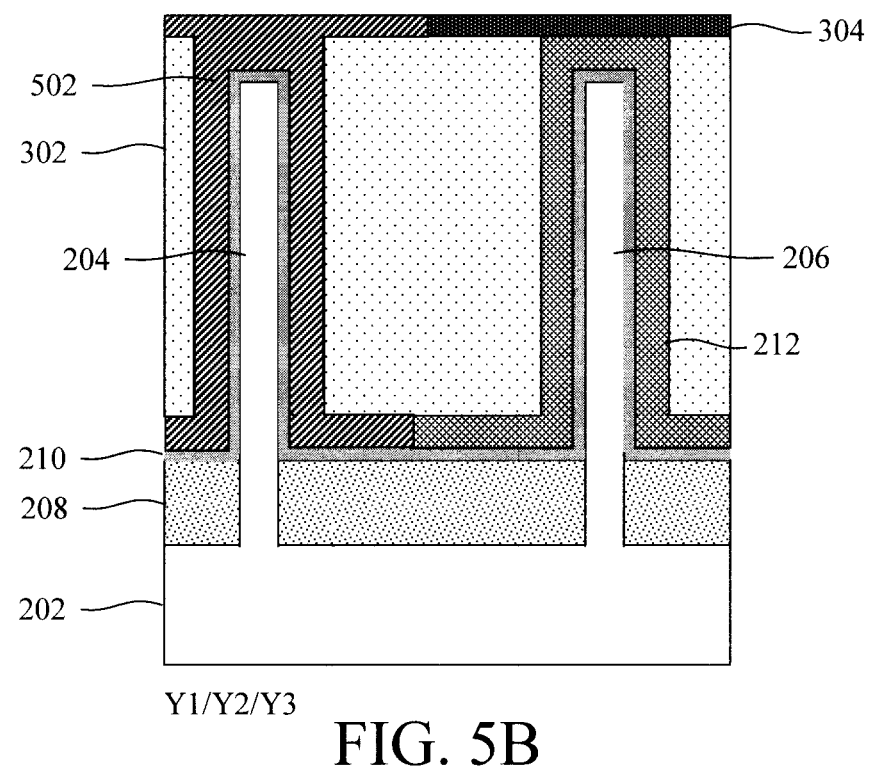
FIG. 5B is a diagram illustrating the first workfunction-setting metal having been deposited into the first cavity from cross-sectional views perpendicular to the fins according to an embodiment of the present invention.

A process such as CVD, ALD or PVD can be employed to deposit the first workfunction-setting metal 502 into cavity 404. Following deposition, the metal overburden can be removed using a process such as CMP. For instance, as shown in FIG. 5B, the top surfaces of the hardmask layer 304 and first workfunction-setting metal 502 are now coplanar.

Figure 6:
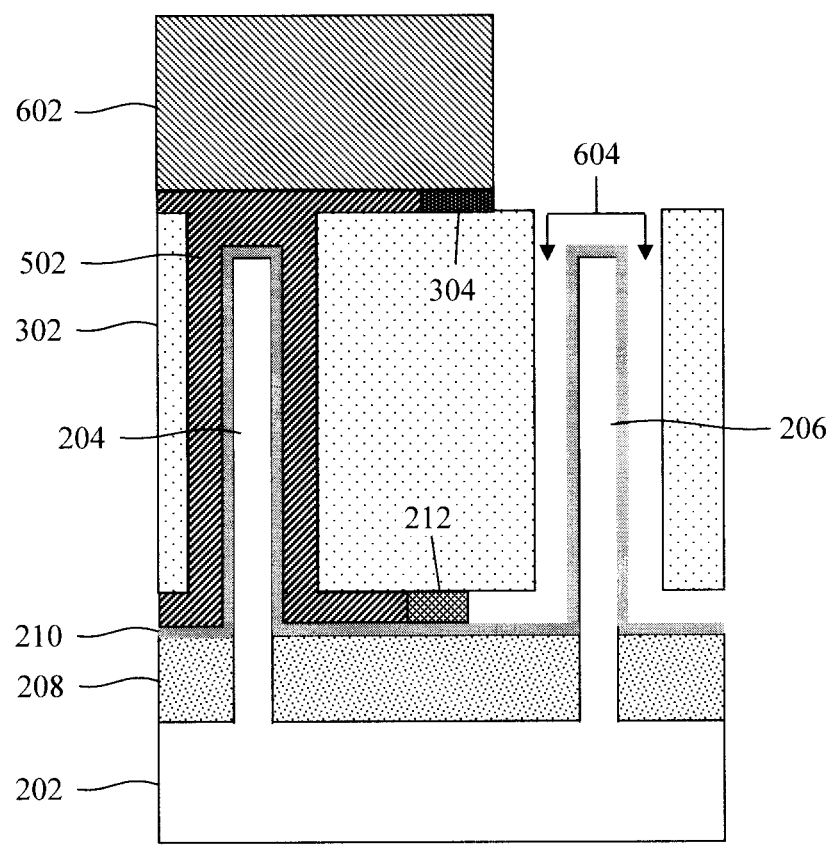
FIG. 6 is a diagram illustrating a block mask having been formed on the first workfunction-setting metal over the NFET fin(s), the hardmask layer having been opened over the PFET fin(s), and the sacrificial layer having been removed from the PFET fin(s) forming a second cavity from cross-sectional views perpendicular to the fins according to an embodiment of the present invention.

As highlighted above, the process is then repeated to selectively remove the sacrificial layer 212 from the PFET fin(s) 206. See FIG. 6. At this point in the process, cross-sectional views Y1/Y2/Y3 (see FIG. 1) of the device structure all appear the same, see FIG. 6. As shown in FIG. 6, a block mask 602 is formed on/covering first workfunction-setting metal 502 and on the hardmask layer 304 over the NFET fin(s) 204. As provided above, suitable block mask materials include, but are not limited to, an OPL material, which can be deposited onto the first workfunction-setting metal 502 and hardmask layer 304 using a casting process such as spin-coating or spray casting.

In the same manner as described above, an etch (such as RIE) using block mask 602 is then employed to open the hardmask layer 304 over the PFET fin(s) 206. Doing so exposes the sacrificial layer 212 over the PFET fin(s) 206 which, as shown in FIG. 6, is then selectively removed. Selective removal of the sacrificial layer 212 forms a (second) cavity 604 over the PFET fin(s) 206.

According to an exemplary embodiment, sacrificial layer 212 is removed from the PFET fin(s) 206 using a non-directional (isotropic) etching process such as a wet chemical etch. For instance, as provided above, sacrificial layer 212 can be formed from a metal nitride such as TiN and/or TaN. In that case, a selective TiN (or TaN) wet chemical etchant can be employed to remove sacrificial layer 212 selective to the high-κ gate dielectric 210 and sacrificial gate material 302. Since the etch is performed over only the PFET fin(s) 206 (i.e., the NFET fin(s) 204 are covered by block mask 602), only the sacrificial layer 212 over the PFET fin(s) 206 will be impacted by the etch. For instance, in some embodiments, a portion of the sacrificial layer 212 remains separating cavity 604 from the first workfunction-setting metal 502. See FIG. 6.

Following removal of the sacrificial layer 212 from the PFET fin(s) 206, the block mask 602 is removed. As provided above, a process such as plasma ashing can be employed to remove an OPL block mask 602.

The sacrificial layer 212 now removed from the PFET fin(s) 206 is then replaced with a second (in this example p-type) workfunction-setting metal 702. See FIG. 7. At this point in the process, cross-sectional views Y1/Y2/Y3 (see FIG. 1) of the device structure all appear the same, see FIG. 7.

Figure 7:
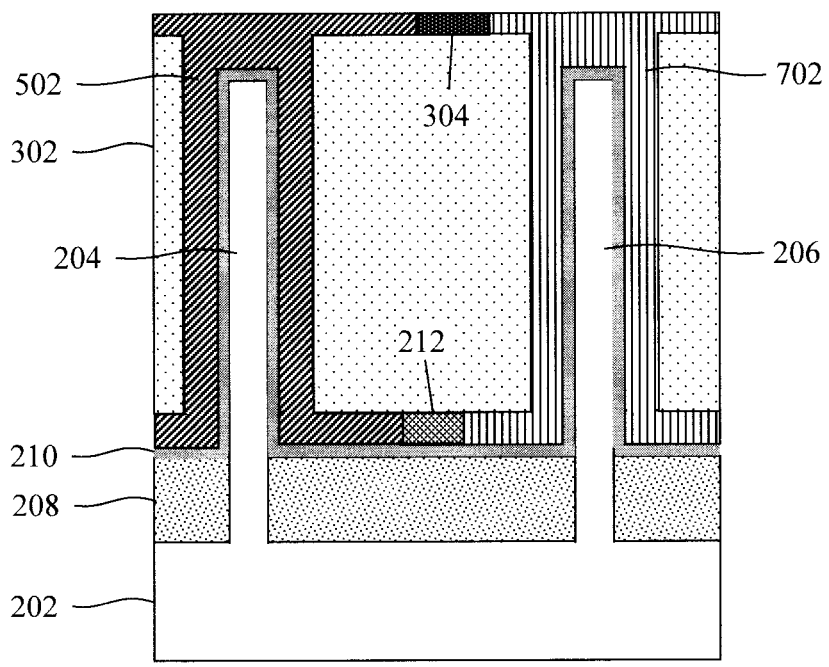
FIG. 7 is a diagram illustrating a second workfunction-setting metal having been deposited into the second cavity from cross-sectional views perpendicular to the fins according to an embodiment of the present invention.

Namely, as shown in FIG. 7, the second workfunction-setting metal 702 is deposited into and filling cavity 604. In this particular example, cavity 604 is present over the PFET fin(s) 206 and the second workfunction-setting metal 702 deposited into cavity 604 is a p-type workfunction-setting metal. Suitable n-type workfunction-setting metals were provided above. A process such as CVD, ALD or PVD can be employed to deposit the second workfunction-setting metal 702 into cavity 604. Following deposition, the metal overburden can be removed using a process such as CMP. For instance, as shown in FIG. 7, the top surfaces of the hardmask layer 304, the first workfunction-setting metal 502 and the second workfunction-setting metal 702 are now all coplanar. Further, as noted above, in some embodiments, a portion of the sacrificial layer 212 remains separating cavity 604 from the first workfunction-setting metal 502. As shown in FIG. 7, this remaining portion of the sacrificial layer 212 now separates the first workfunction-setting metal 502 from the second workfunction-setting metal 702 at the base of the NFET fins(s) 204 and PFET fin(s) 206, respectively.

Figure 8A:
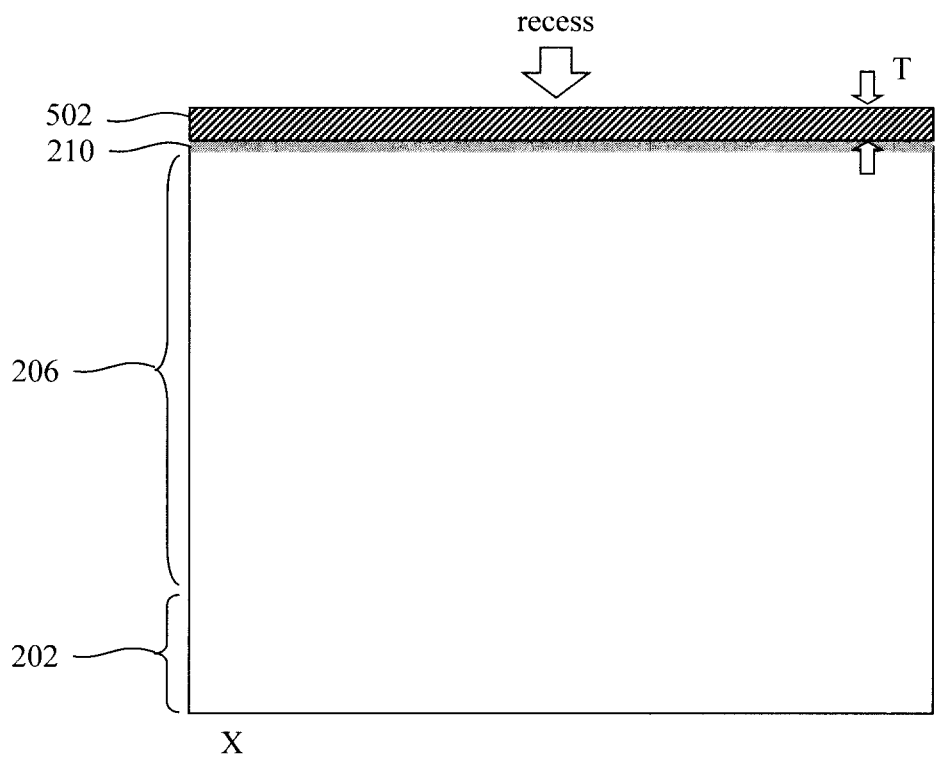
FIG. 8A is a diagram illustrating the first workfunction-setting metal having been recessed from a cross-sectional view parallel to one of the fins.
Figure 8B:
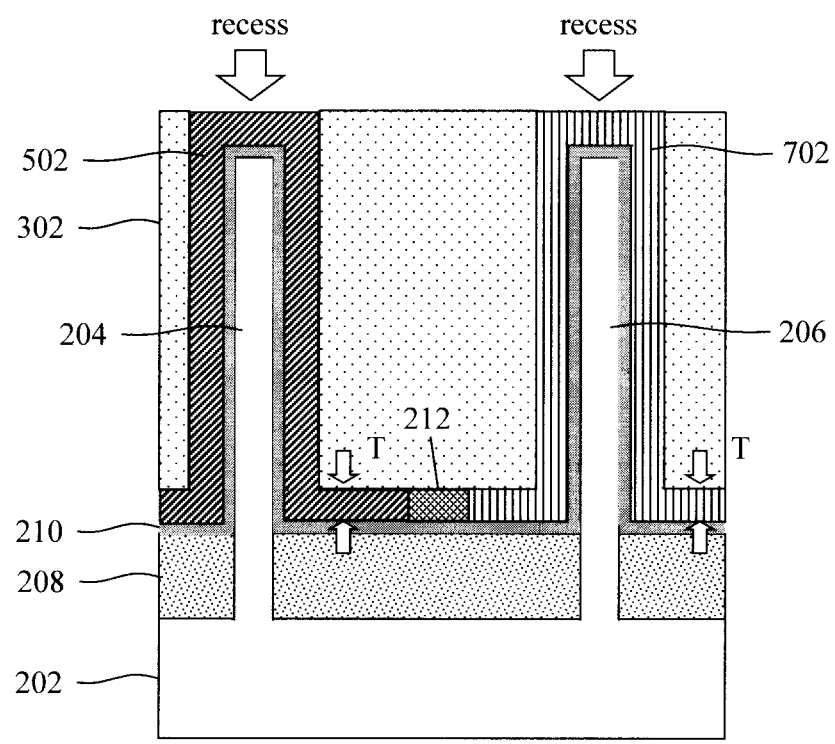
FIG. 8B is a diagram illustrating the first workfunction-setting metal and the second workfunction-setting metal having been recessed from cross-sectional views perpendicular to the fins according to an embodiment of the present invention.

The top of the first workfunction-setting metal 502 and the second workfunction-setting metal 702 (and the remaining portion of the hardmask layer 304, if any) are then recessed down to the underlying sacrificial gate material 302. See FIGS. 8A and 8B. FIG. 8A provides a cross-sectional view X (see FIG. 1) through the device structure. At this point in the process, cross-sectional views Y1/Y2/Y3 (see FIG. 1) of the device structure all appear the same, see FIG. 8B. A process such as CMP or other suitable etch back process can be used to recess the first workfunction-setting metal 502 and second workfunction-setting metal 702.

Notably, a unique feature of the present process is that the first workfunction-setting metal 502 and second workfunction-setting metal 702 all have the same thickness T in each of the PFET and NFET devices. See FIGS. 8A and 8B. This is the result of using the same sacrificial layer 212 (of thickness T—see above) for both the NFET and PFET devices. That way, when this common sacrificial layer 212 is removed from the NFET and PFET devices and replaced with the first/second workfunction-setting metals as described above, those workfunction-setting metals too will have the thickness T.

Recessing the first workfunction-setting metal 502 and the second workfunction-setting metal 702 in this manner exposes the sacrificial gate material 302, which is then selectively removed. See FIG. 9. At this point in the process, cross-sectional views Y1/Y2/Y3 (see FIG. 1) of the device structure all appear the same, see FIG. 9. As provided above, the sacrificial gate material 302 can be poly-Si and/or a-Si. In that case, an Si-selective etching process such as a Si-selective RIE can be used to remove the sacrificial gate material 302 from the first workfunction-setting metal 502 and the second workfunction-setting metal 702. As highlighted above and shown in FIG. 9, a unique result of the present process is that the first workfunction-setting metal 502 over the NFET fin(s) 204 and second workfunction-setting metal 702 over the PFET fin(s) 206 all have the same thickness T in each device.

Figure 9:
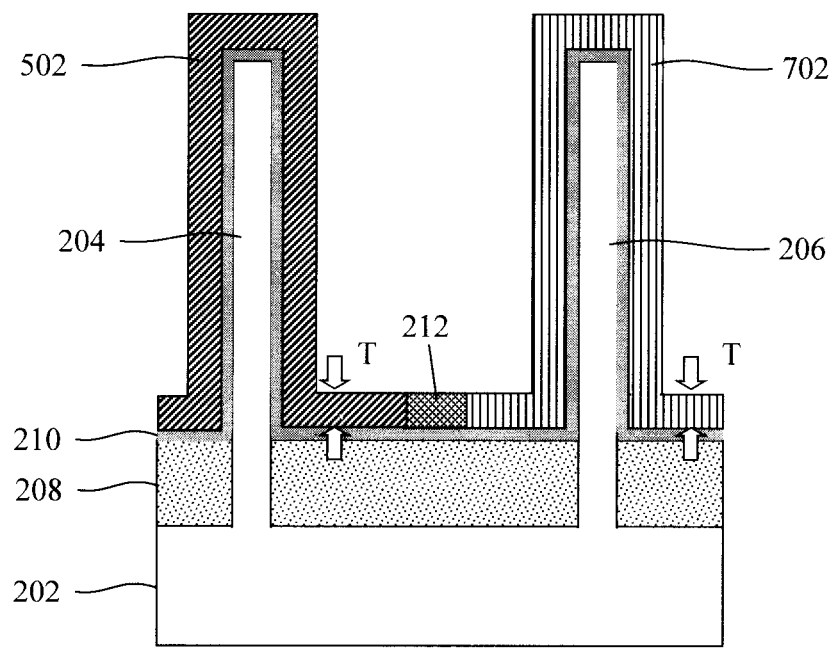
FIG. 9 is a diagram illustrating the sacrificial gate material having been selectively removed from cross-sectional views perpendicular to the fins according to an embodiment of the present invention.
Figure 10A:
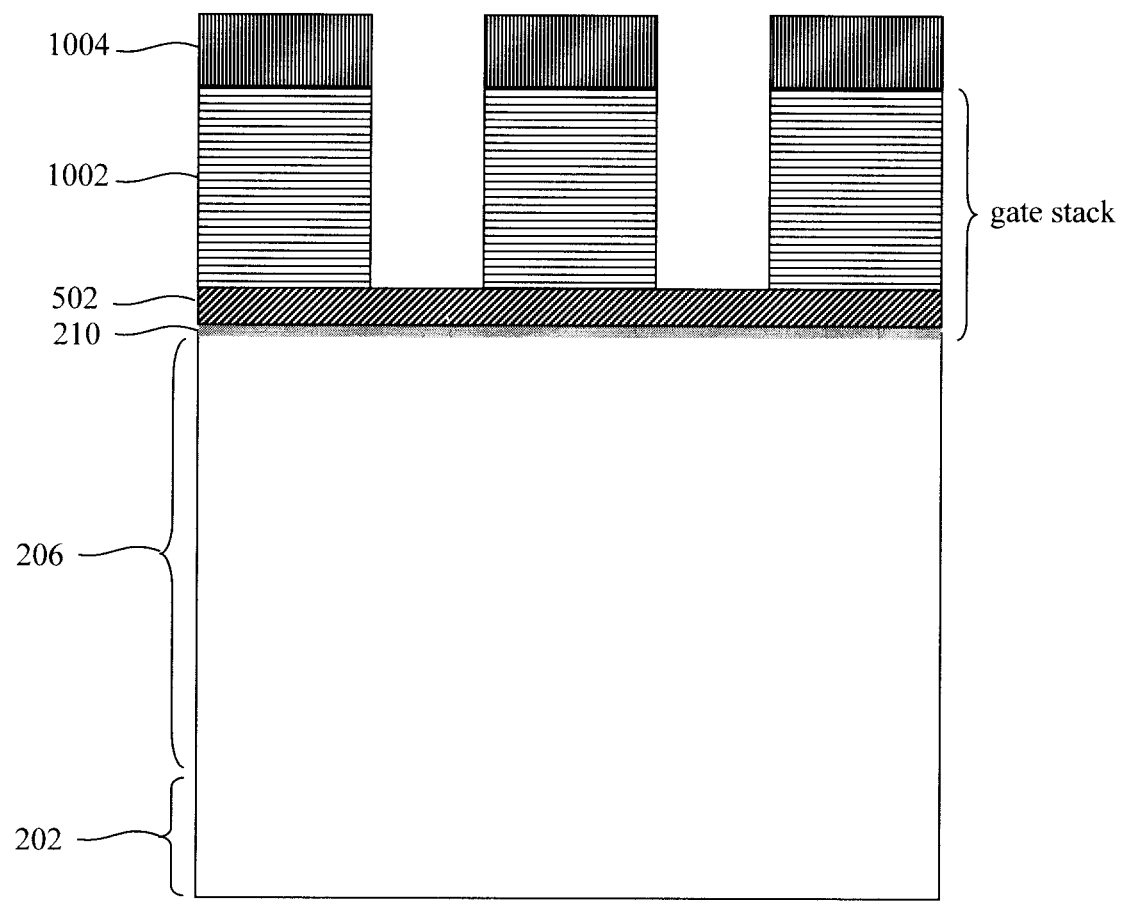
FIG. 10A is a diagram illustrating a patterned hardmask having been used to form dielectric gates over the first workfunction-setting metal from a cross-sectional view parallel to one of the fins.

Dielectric gates 1002 are then formed over the first workfunction-setting metal 502 and second workfunction-setting metal 702 in gate regions of the NFET and PFET devices. See FIGS. 10A and 10B. FIG. 10A provides a cross-sectional view X (see FIG. 1) through the device structure. At this point in the process, cross-sectional views Y1/Y2 (see FIG. 1) of the device structure all appear the same, see FIG. 10B. Cross-sectional view Y3 is outside of the gate regions of the NFET and PFET devices and, following formation of the dielectric gates 1002, appears the same as shown in FIG. 9 and described above.

To form the dielectric gates 1002, a dielectric gate material is first deposited onto the NFET fin(s) 204 and PFET fin(s) 206 over the first workfunction-setting metal 502 and the second workfunction-setting metal 702. Suitable dielectric gate materials include, but are not limited to, SiOx, silicon carbide (SiC) and/or silicon oxycarbide (SiOC). A process such as CVD, ALD or PVD can be used to deposit the dielectric gate material onto the NFET fin(s) 204 and PFET fin(s) 206. Following deposition, the dielectric gate material is planarized using a process such as CMP.

A patterned hardmask 1004 is then formed on the dielectric gate material marking the footprint and location of the dielectric gates 1002. Suitable materials for hardmask 1004 include, but are not limited to, nitride hardmask materials such as SiN, SiON and/or SiCN. An etch using hardmask 1004 is then employed to pattern the dielectric gate material into the individual dielectric gates 1002 shown in FIGS. 10A and 10B. A directional (anisotropic) etching process such as RIE can be used for the dielectric gate material etch. It is notable that this etch will remove the dielectric gate material outside of the gate regions of the NFET and PFET devices. Thus, as highlighted above, the cross-sectional view Y3 outside of the gate regions of the NFET and PFET devices appears the same as shown in FIG. 9 and described above.

The dielectric gates 1002 over the first/second workfunction-setting metal 502/702 and the high-κ gate dielectric 210 are also referred to herein as 'gate stacks.' It is notable that, while the dielectric gates 1002 add height to the gate stacks, the dielectric gates 1002 do not add any additional metal to the gate stacks. Thus, dielectric gates 1002 do not contribute to the parasitic capacitance later formed between the gate and contacts.

Figure 10B:
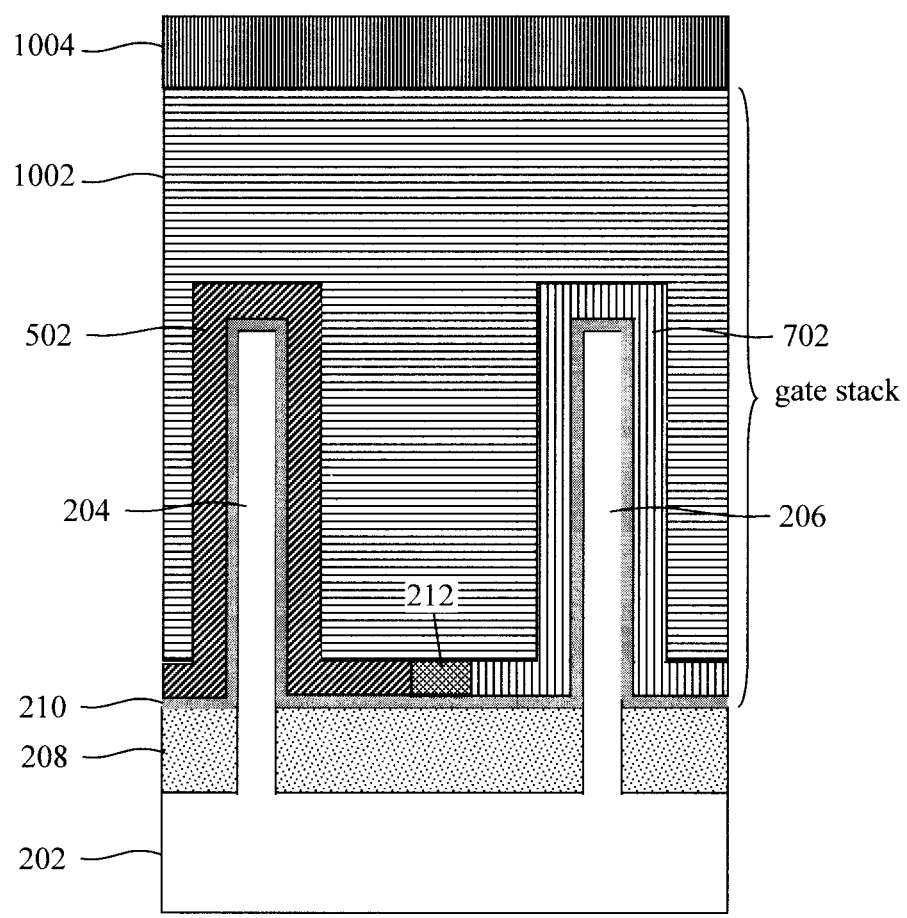
FIG. 10B is a diagram illustrating the patterned hardmask having been used to form a dielectric gate over the first workfunction-setting metal and the second workfunction-setting metal from cross-sectional views perpendicular to the fins through the center and edge of one of the gates according to an embodiment of the present invention.
Figure 11A:
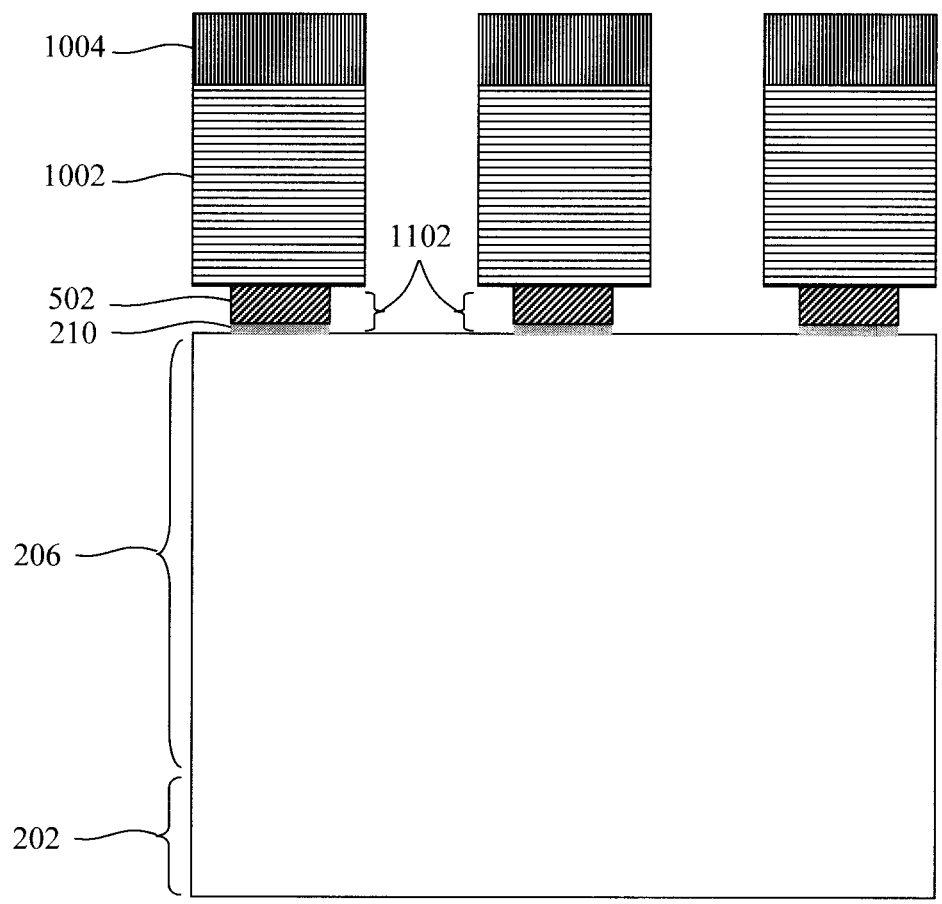
FIG. 11A is a diagram illustrating a recess etch of the high-κ gate dielectric and first workfunction-setting metal having been performed forming divots beneath the dielectric gates from a cross-sectional view parallel to one of the fins.
Figure 11B:
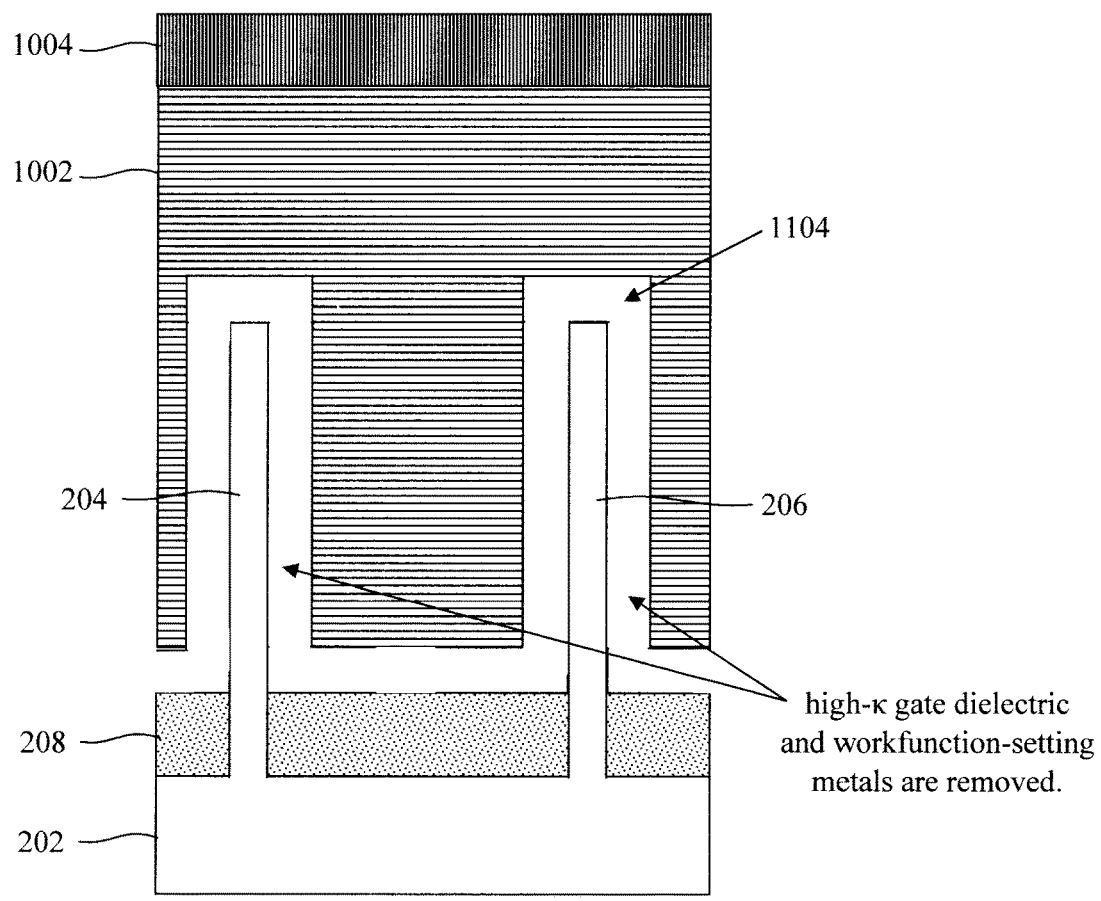
FIG. 11B is a diagram illustrating the recess etch of the high-κ gate dielectric, first workfunction-setting metal, and second workfunction-setting metal having been used to form the divots beneath the dielectric gates from a cross-sectional view perpendicular to the fins through the edge of one of the gates.
Figure 11C:
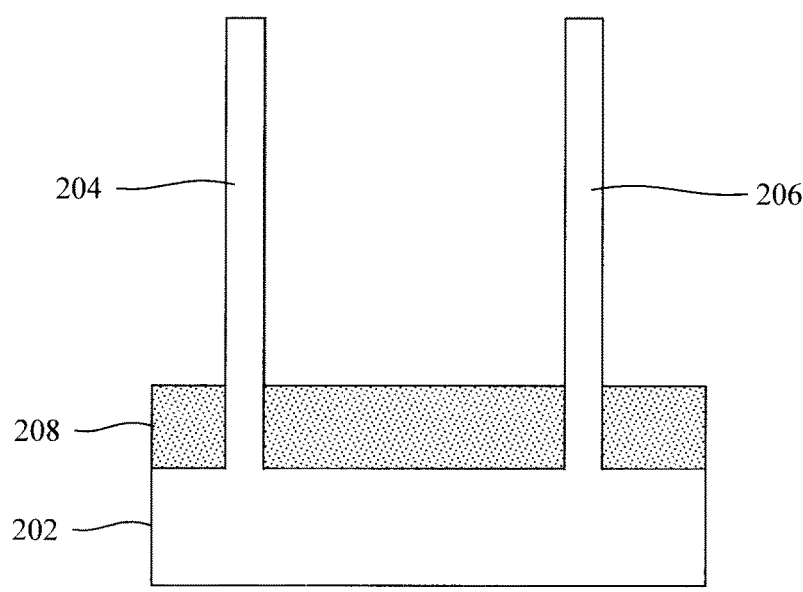
FIG. 11C is a diagram illustrating the high-κ gate dielectric, first workfunction-setting metal, and second workfunction-setting metal having been removed outside of the gate region from a cross-sectional view perpendicular to the fins in between gates according to an embodiment of the present invention.

An etch of the high-κ gate dielectric 210 and first/second workfunction-setting metal 502/702 is then performed. See FIGS. 11A, 11B and 11C. FIG. 11A provides a cross-sectional view X (see FIG. 1) through the device structure. FIG. 11B provides a cross-sectional view Y2 (see FIG. 1) through the device structure. FIG. 11C provides a cross-sectional view Y3 (see FIG. 1) through the device structure. The cross-sectional view Y1 remains unchanged from what is shown in FIG. 10B and described above.

Referring first to FIG. 11A, this etch of the high-κ gate dielectric 210 and workfunction-setting metals removes the high-κ gate dielectric 210 and workfunction-setting metals from between the dielectric gates 1002. Due to the isotropic nature of the etch, the high-κ gate dielectric 210 and first/second workfunction-setting metal 502/702 are recessed beneath the dielectric gates 1002 at the tops of the NFET fin(s) 204 and PFET fin(s) 206, forming divots 1102 beneath the dielectric gates 1002. It is to be understood, that while the view shown in FIG. 11A depicts the NFET fin(s) 204 and first workfunction-setting metal 502, the same result occurs on the PFET fin(s) 206 with high-κ gate dielectric 210 and second workfunction-setting metal 702. According to an exemplary embodiment, the high-κ gate dielectric 210 and first/second workfunction-setting metal 502/702 are recessed using a non-directional (isotropic) etching process such as a metal-selective wet chemical etch.

As shown in FIG. 11B, due to the isotropic nature of the etch, the high-κ gate dielectric 210 and first/second workfunction-setting metal 502/702 are recessed beneath the dielectric gates 1002 at the edges of the gate stacks (and thus no longer visible in the cross-sectional view Y2), forming the divots 1102 at the edges of the gate stacks. The etch will not impact the high-κ gate dielectric 210 and first/second workfunction-setting metal 502/702 directly under dielectric gates 1002. Thus, as highlighted above, the cross-sectional view Y1 remains unchanged from what is shown in FIG. 10B and described above.

As shown in FIG. 11C, the etch completely removes the high-κ gate dielectric 210 and first/second workfunction-setting metal 502/702 from the area outside of the gate regions of the NFET and PFET devices. The NFET fin(s) 204 and PFET fin(s) 206 are now uncovered in this area.

Figure 12A:
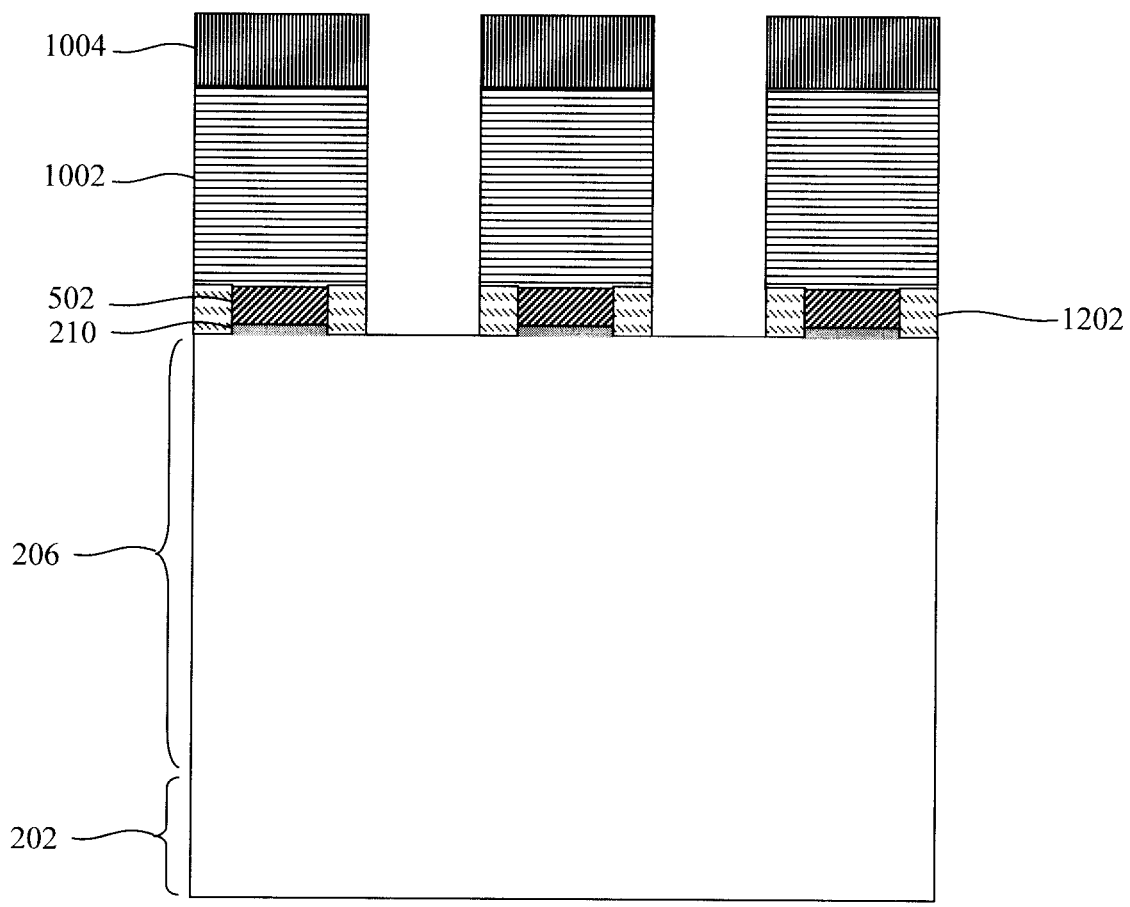
FIG. 12A is a diagram illustrating inner spacers having been formed in the divots from a cross-sectional view parallel to one of the fins.
Figure 12B:
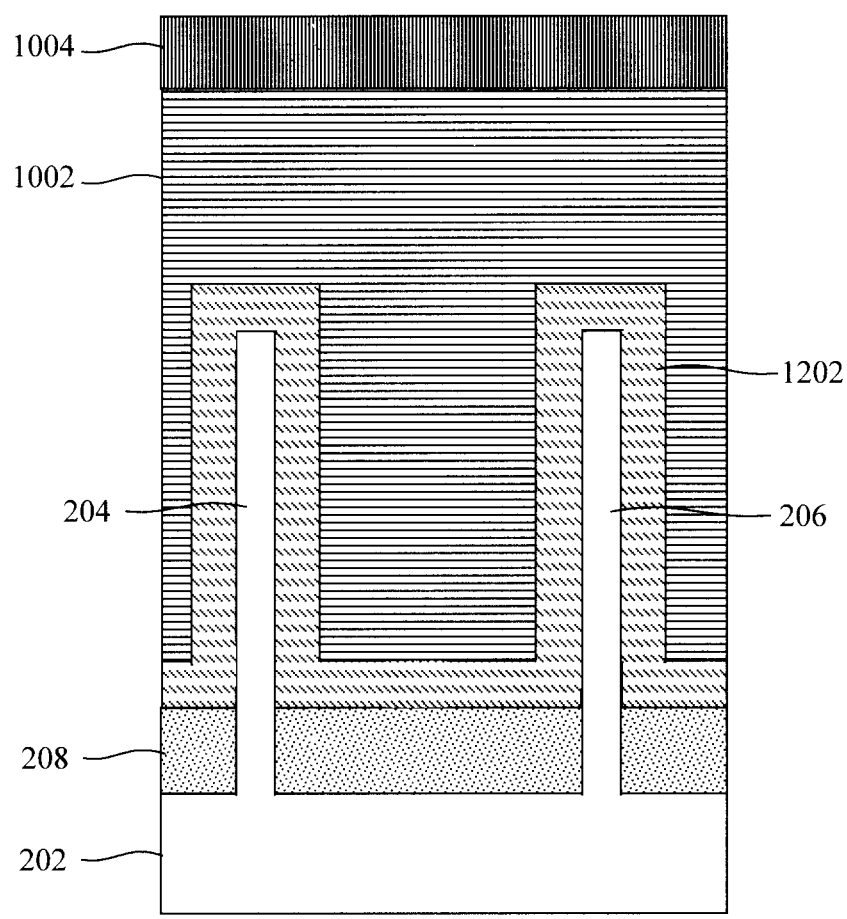
FIG. 12B is a diagram illustrating the inner spacers having been formed in the divots from a cross-sectional view perpendicular to the fins through the edge of one of the gates according to an embodiment of the present invention.

An inner spacer 1202 is then formed in the divots 1102 (resulting from the isotropic etch of the high-κ gate dielectric 210 and first/second workfunction-setting metal 502/702 as described above). See FIGS. 12A and 12B. FIG. 12A provides a cross-sectional view X (see FIG. 1) through the device structure. FIG. 12B provides a cross-sectional view Y2 (see FIG. 1) through the device structure. The cross-sectional view Y1 remains unchanged from what is shown in FIG. 10B and described above. The cross-sectional view Y3 remains unchanged from what is shown in FIG. 11C and described above.

As shown in FIGS. 12A and 12B, inner spacer 1202 have been formed in the divots 1102. Suitable inner spacer 1202 materials include, but are not limited to, dielectric materials such as SiOx, silicon oxycarbide (SiOC), SiN, SiON, SiCN and/or silicon oxycarbon nitride (SiOCN). According to an exemplary embodiment, the inner spacer material is deposited onto the device structure filling the divots 1102. An etch is then used to remove the excess inner spacer material, forming the inner spacer 1202 in divots 1102. A process such as CVD, ALD or PVD can be employed to deposit the inner spacer material. An isotropic etching process such as RIE can be employed to remove the excess inner spacer material.

Source and drains are next formed in the NFET fin(s) 204 and PFET fin(s) 206 between the NFET gate stacks (high-κ gate dielectric 210/first workfunction-setting metal 502/dielectric gates 1002) and the PFET gate stacks (high-κ gate dielectric 210/second workfunction-setting metal 702/dielectric gates 1002). As will be described in detail below, the inner spacers 1202 separate the source and drains from the NFET/PFET gate stacks.

Figure 13A:
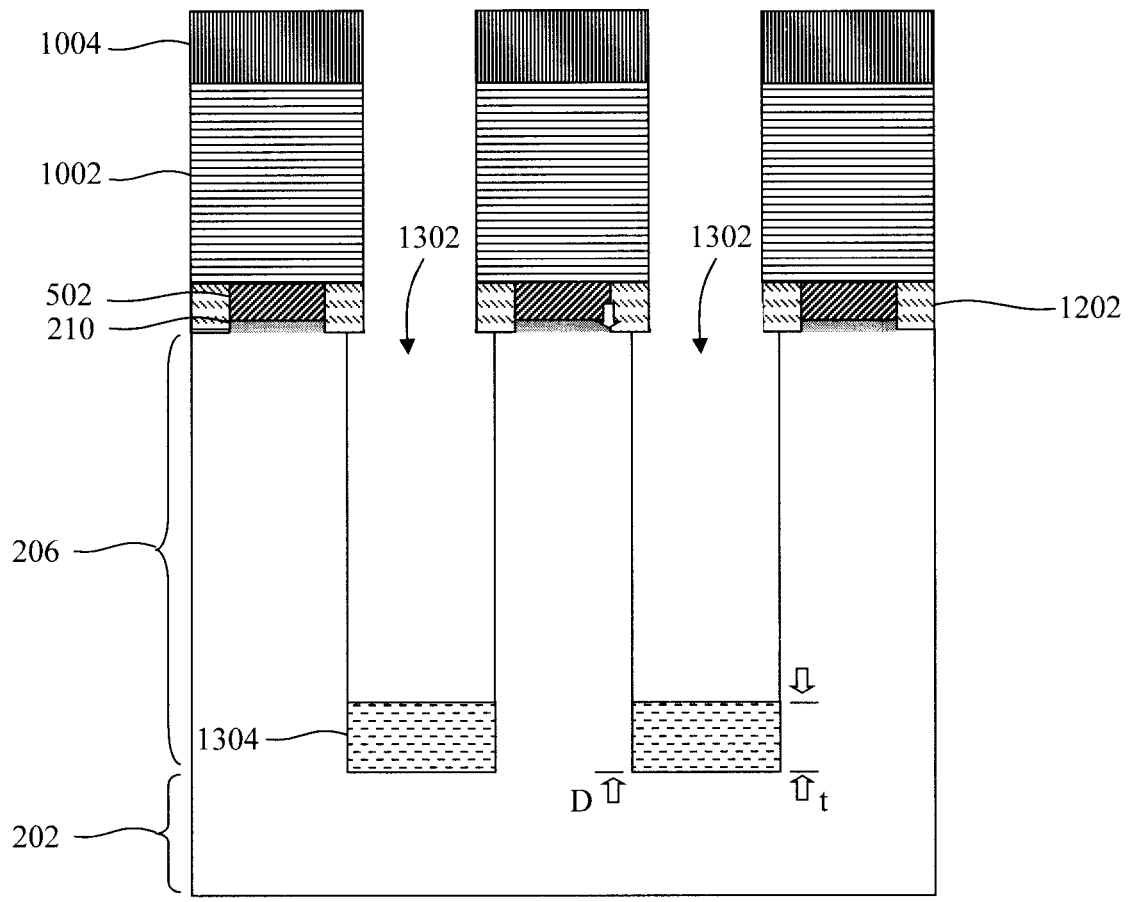
FIG. 13A is a diagram illustrating trenches having been formed in the NFET fin(s) in between the gate stacks, and bottom isolation regions having been formed at the bottom of the trenches from a cross-sectional view parallel to one of the fins.
Figure 13B:
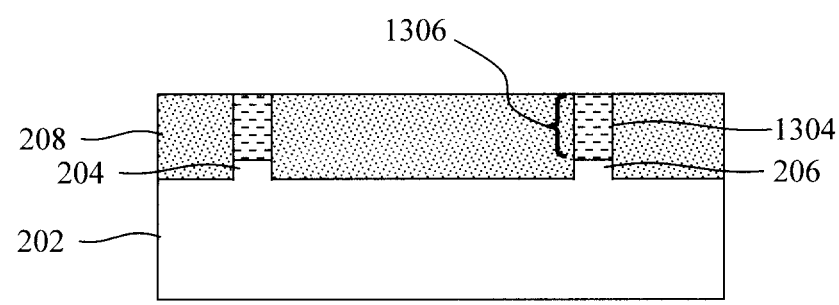
FIG. 13B is a diagram illustrating the NFET and PFET fins having been recessed outside of the gate region, and the bottom isolation regions having been formed over the recessed NFET and PFET fins from a cross-sectional view perpendicular to the fins in between gates according to an embodiment of the present invention.

To form the source and drains, a source and drain recess etch of the NFET fin(s) 204 and PFET fin(s) 206 is first performed. See FIGS. 13A and 13B. FIG. 13A provides a cross-sectional view X (see FIG. 1) through the device structure. FIG. 13B provides a cross-sectional view Y3 (see FIG. 1) through the device structure. The cross-sectional view Y1 remains unchanged from what is shown in FIG. 10B and described above. The cross-sectional view Y2 remains unchanged from what is shown in FIG. 12B and described above.

As shown in FIG. 13A, this source and drain recess etch forms trenches 1302 in the NFET fin(s) 204 in between the NFET gate stacks (high-κ gate dielectric 210/first workfunction-setting metal 502/dielectric gates 1002). Although not visible in this view, it is to be understood that the source and drain recess etch also forms these trenches 1302 in the PFET fin(s) 206 in between the PFET gate stacks (high-κ gate dielectric 210/second workfunction-setting metal 702/dielectric gates 1002) which appear exactly the same as shown in FIG. 13A just on the opposite fin(s).

A directional (anisotropic) etching process such as RIE can be employed for source and drain recess etch. The hardmask 1004 protects the underlying NFET/PFET gate stacks. As such, no etching occurs in the gate region of the device structure which is fully covered by hardmask 1004, and thus why cross-sectional view Y1 remains unchanged from what is shown in FIG. 10B and cross-sectional view Y2 remains unchanged from what is shown in FIG. 12B.

Following the source and drain recess etch, bottom isolation regions 1304 are formed at the bottoms of the trenches 1302. According to an exemplary embodiment, bottom isolation regions 1304 are formed by depositing an insulator material into the trenches 1302, and then recessing the insulator material to form the bottom isolation regions 1304. Suitable insulator materials include, but are not limited to, SiOx. A process such as CVD, ALD or PVD can be employed to deposit the insulator material into the trenches 1302. When the insulator material is an oxide, an oxide-selective RIE can be employed to recess the insulator material. According to an exemplary embodiment, the trenches 1302 have a depth D of from about 20 nm to about 40 nm and ranges therebetween, and the bottom isolation regions 1304 have a thickness t of from about 2 nm to about 5 nm and ranges therebetween. As shown in FIG. 13B, in the source and drain regions, this source and drain recess etch recesses the NFET fins(s) 204 and PFET fin(s) 206 below a top surface of the STI regions 208 forming trenches 1306 which (along with trenches 1302) are then filled with the insulator material (e.g., SiOx) to form the bottom isolation regions 1304.

Figure 14A:
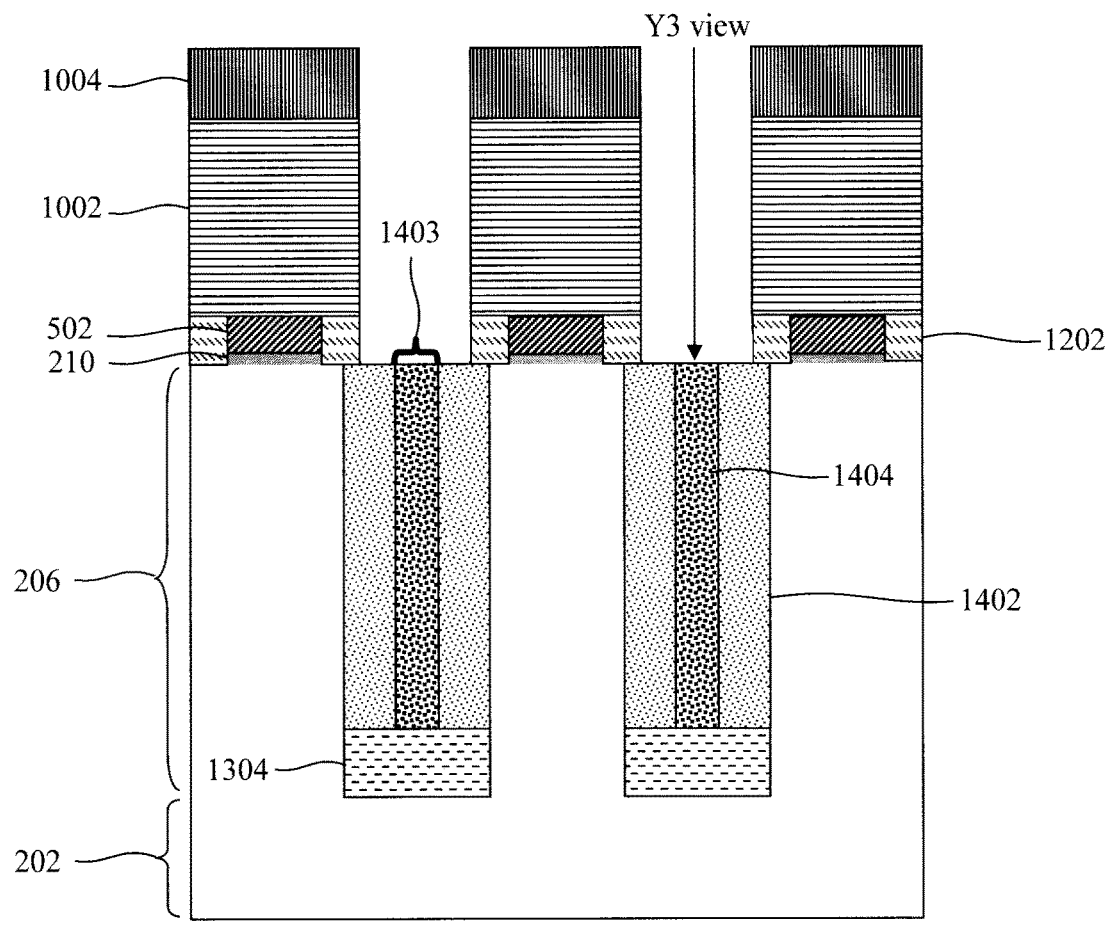
FIG. 14A is a diagram illustrating source and drains having been formed along inner sidewalls of the trenches, and sacrificial contacts having been formed in the trenches in gaps between the source and drains from a cross-sectional view parallel to one of the fins.
Figure 14B:
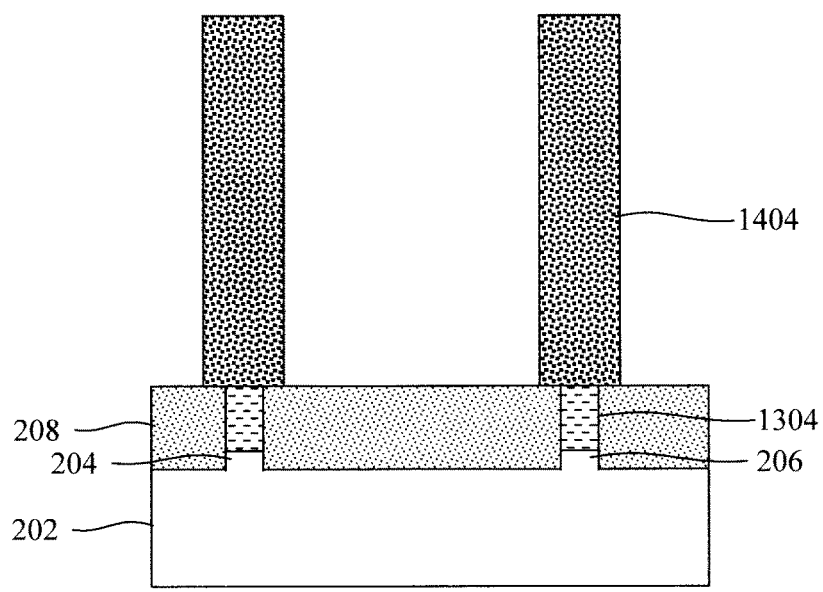
FIG. 14B is a diagram illustrating the sacrificial contacts having been formed on the bottom isolation regions over the recessed NFET and PFET fins from a cross-sectional view perpendicular to the fins in between gates according to an embodiment of the present invention.

Source and drains 1402 are then formed along the inner/opposite sidewalls of trenches 1302, and sacrificial contacts 1404 are formed between the source and drains 1402 over the bottom isolation regions 1304. See FIGS. 14A and 14B. FIG. 14A provides a cross-sectional view X (see FIG. 1) through the device structure. FIG. 14B provides a cross-sectional view Y3 (see FIG. 1) through the device structure. The cross-sectional view Y1 remains unchanged from what is shown in FIG. 10B and described above. The cross-sectional view Y2 remains unchanged from what is shown in FIG. 12B and described above. The sacrificial contacts 1404 serves as a placeholder for the source and drain contacts.

Referring first to FIG. 14A, according to an exemplary embodiment, the source and drains 1402 are formed from an in-situ doped (i.e., during growth) or ex-situ doped (e.g., via ion implantation) epitaxial material. Suitable materials for source and drains 1402 include, but are not limited to, epitaxial Si, epitaxial Ge and/or epitaxial SiGe. Suitable n-type dopants include, but are not limited to, phosphorous (P) and/or arsenic (As). Suitable p-type dopants include, but are not limited to, boron (B). Epitaxial growth will be limited to the exposed surfaces within trenches 1302 above the bottom isolation regions 1304. Thus, since the bottom isolation regions 1304 are present at the bottoms of the trenches 1302, epitaxial source and drains 1402 will be formed along the opposite inner sidewalls of trenches 1302 as shown in FIG. 14A. Notably, inner spacer 1202 separates the NFET gate stacks (high-κ gate dielectric 210/first workfunction-setting metal 502/dielectric gates 1002) and PFET gate stacks (high-κ gate dielectric 210/second workfunction-setting metal 702/dielectric gates 1002) from the source and drains 1402.

Gaps 1403 present between the source and drains 1402 on the opposite inner sidewalls of trenches 1302 are then filled with a sacrificial material to form the sacrificial contacts 1404. Suitable sacrificial contact 1404 materials include, but are not limited to, metal oxides such as titanium oxide (TiOx) and/or tantalum oxide (TaOx). A process such as CVD, ALD or PVD can be used to deposit the sacrificial material. Following deposition, the sacrificial material can be planarized using a process such as CMP.

FIG. 14B depicts the sacrificial contacts 1404 having been formed over the bottom isolation regions 1304 outside of the gate regions of the device structure. To clarify the shape/configuration of the sacrificial contacts 1404 in this region of the device structure, it is noted that the cross-sectional view Y3 shown in FIG. 14B depicts a cut down through the center of one of the sacrificial contacts 1404. For illustrative purposes only, the orientation of this Y3 cut is shown in FIG. 14A. As provided above, the orientations of each of the cross-sectional cuts provided herein are also depicted in FIG. 1.

Figure 15A:
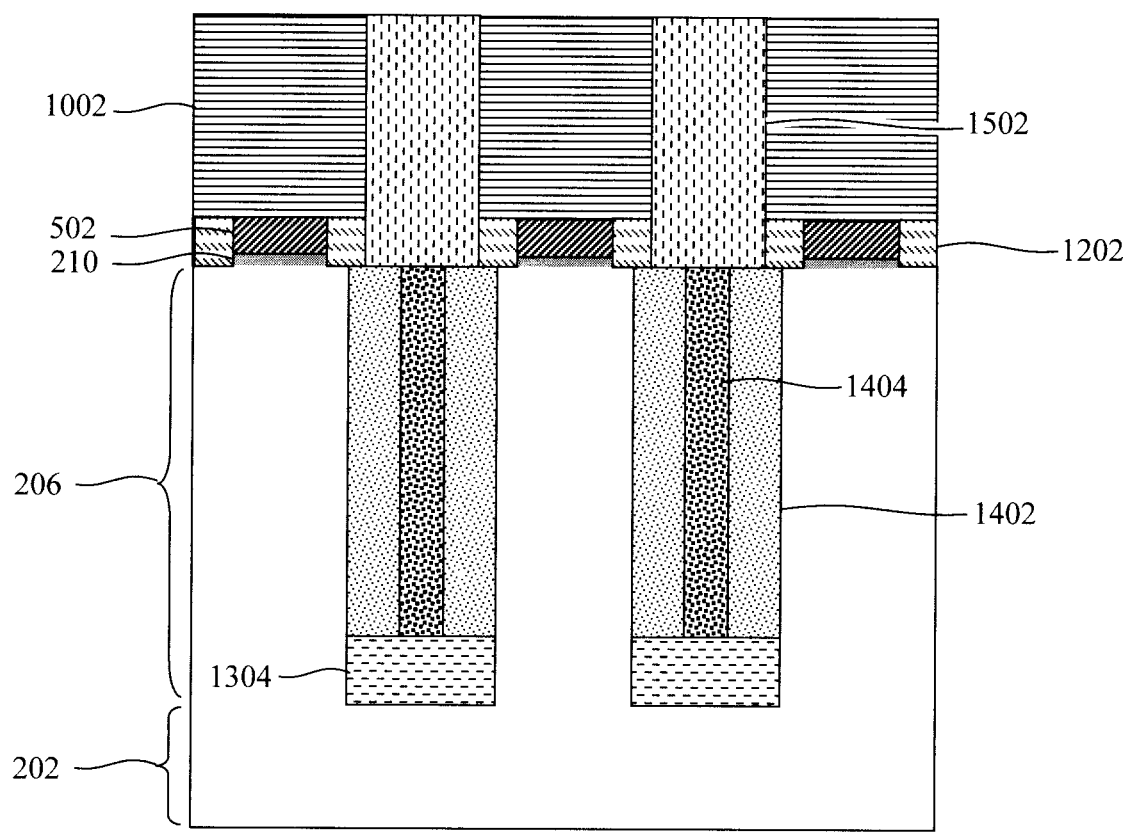
FIG. 15A is a diagram illustrating an ILD having been deposited over the NFET fin(s) and planarized, removing the patterned hardmask from a cross-sectional view parallel to one of the fins.
Figure 15B:
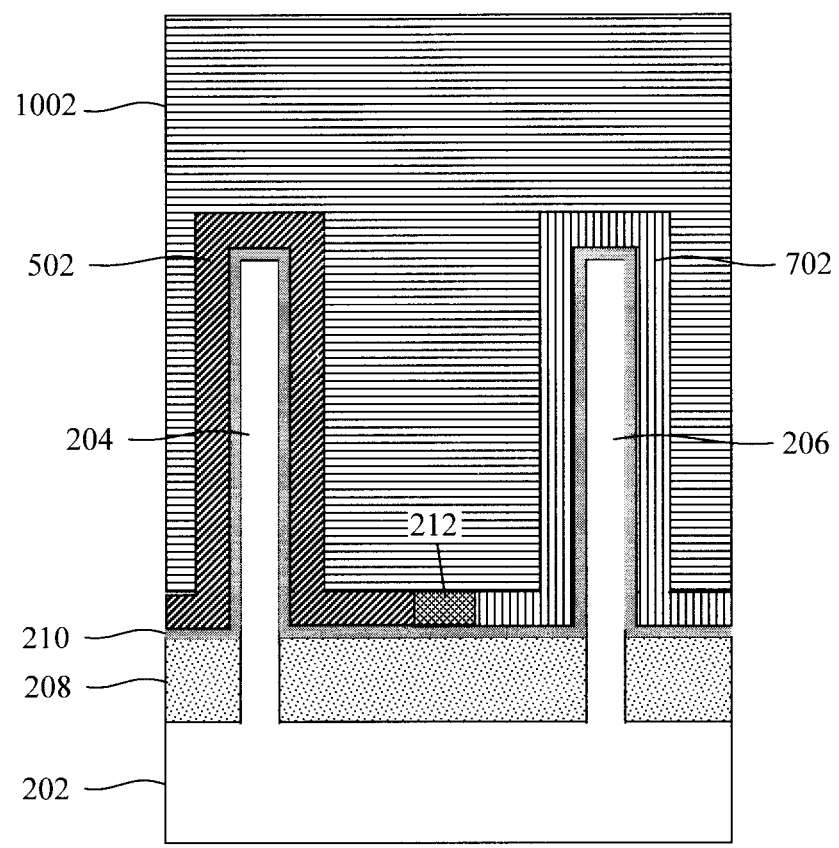
FIG. 15B is a diagram illustrating the patterned hardmask having been removed from a cross-sectional view perpendicular to the fins through the center of one of the gates.
Figure 15C:
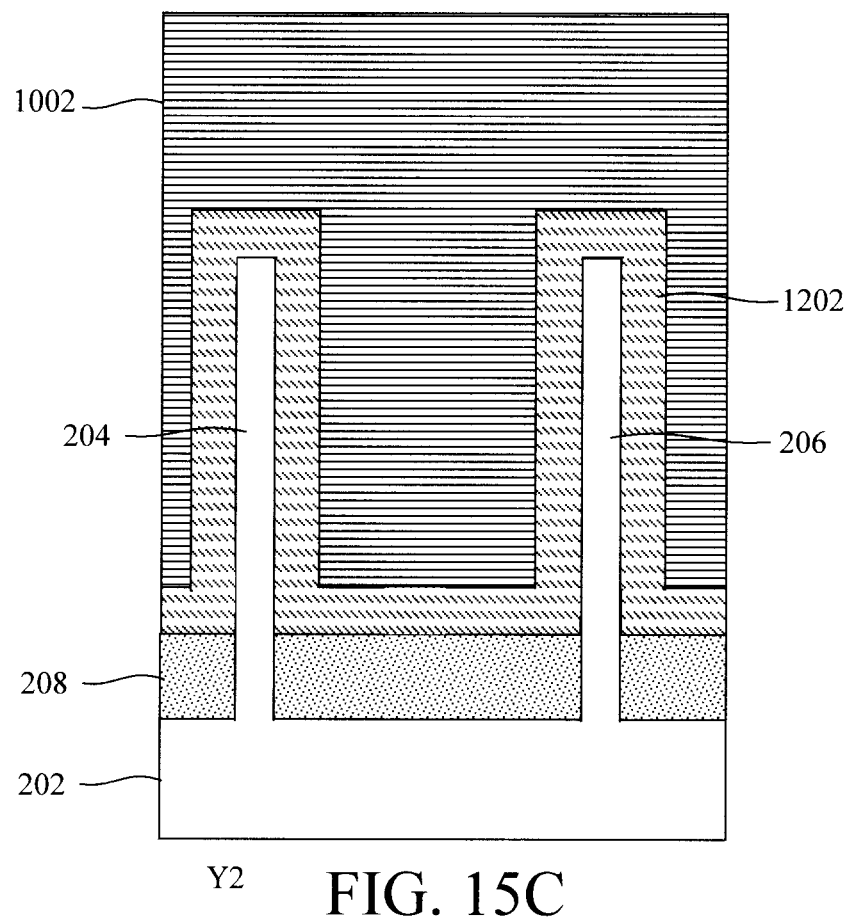
FIG. 15C is a diagram illustrating the patterned hardmask having been removed from a cross-sectional view perpendicular to the fins through the edge of one of the gates.
Figure 15D:
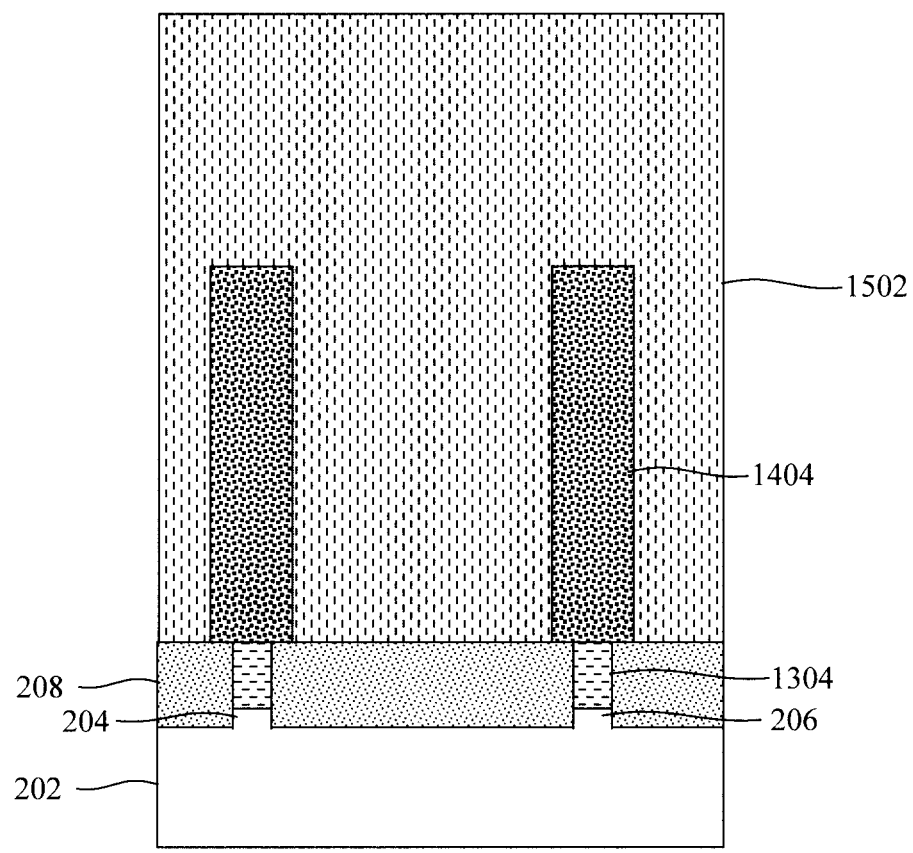
FIG. 15D is a diagram illustrating the ILD having been deposited over the sacrificial contacts outside of the gate region from a cross-sectional view perpendicular to the fins in between gates according to an embodiment of the present invention.

An interlayer dielectric (ILD) is then deposited over the NFET fins(s) 204 and PFET fin(s) 206. See FIGS. 15A, 15B, 15C and 15D. FIG. 15A provides a cross-sectional view X (see FIG. 1) through the device structure. FIG. 15B provides a cross-sectional view Y1 (see FIG. 1) through the device structure. FIG. 15C provides a cross-sectional view Y2 (see FIG. 1) through the device structure. FIG. 15D provides a cross-sectional view Y3 (see FIG. 1) through the device structure.

Suitable ILD 1502 materials include, but are not limited to, oxide low-κ materials such as SiOx and/or oxide ultralow-κ interlayer dielectric (ULK-ILD) materials, e.g., having a dielectric constant κ of less than 2.7. By comparison, silicon dioxide (SiO$_2$) has a dielectric constant κ value of 3.9. Suitable ultralow-κ dielectric materials include, but are not limited to, porous organosilicate glass (pSiCOH). A process such as CVD, ALD or PVD can be employed to deposit ILD 1502. Following deposition, ILD 1502 can be planarized using a process such as CMP, removing the hardmask 1004.

As shown in FIG. 15A, ILD 1502 is now present between the NFET gate stacks (high-κ gate dielectric 210/first workfunction-setting metal 502/dielectric gates 1002) over the sacrificial contacts 1404. Although not visible in this view, it is to be understood that ILD 1502 is also present in between the PFET gate stacks (high-κ gate dielectric 210/second workfunction-setting metal 702/dielectric gates 1002) over the sacrificial contacts 1404 which appears exactly the same as shown in FIG. 15A just on the opposite fin(s). As shown in FIGS. 15B and 15C, hardmask 1004 has now been removed. As shown in FIG. 15D, the sacrificial contacts 1404 are now buried in ILD 1502 outside of the gate region of the device.

Figure 16A:
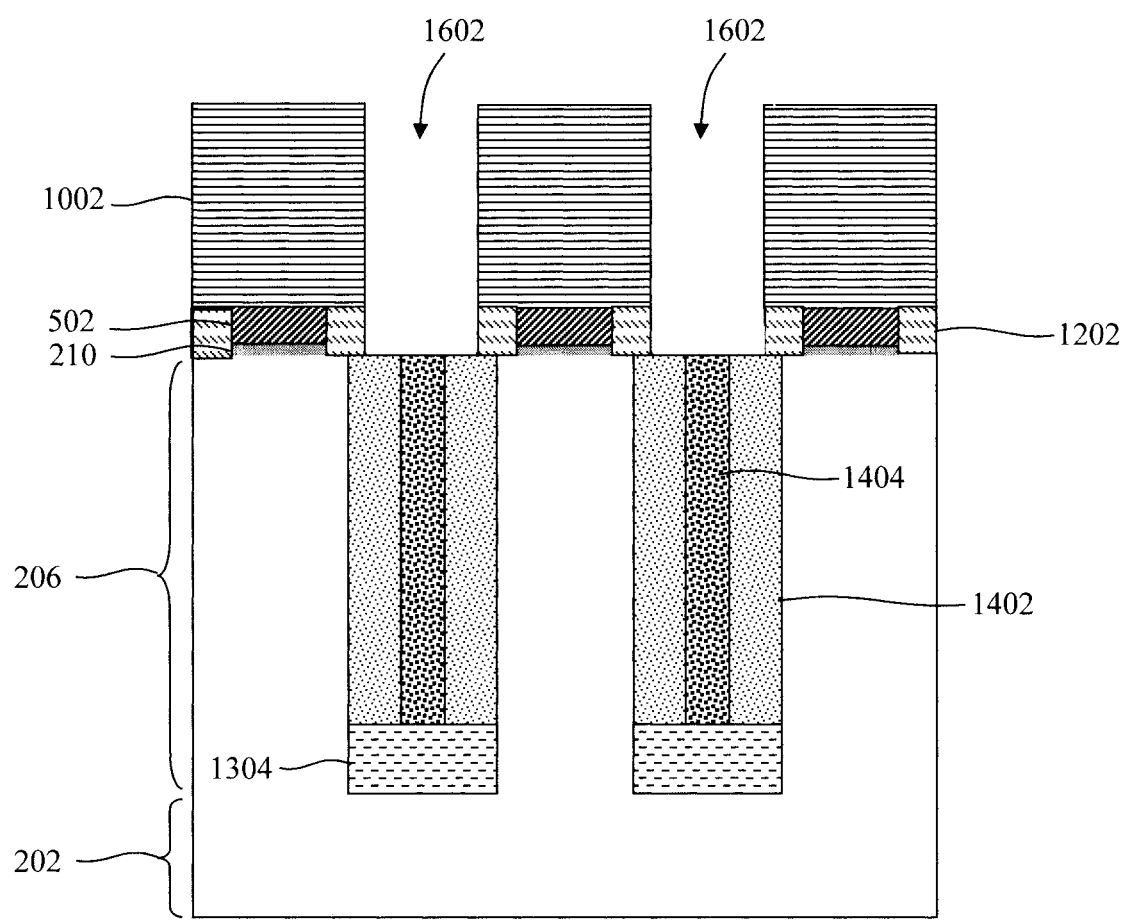
FIG. 16A is a diagram illustrating source and drain contact trenches having been formed in the ILD over the sacrificial contacts from a cross-sectional view parallel to one of the fins.
Figure 16B:
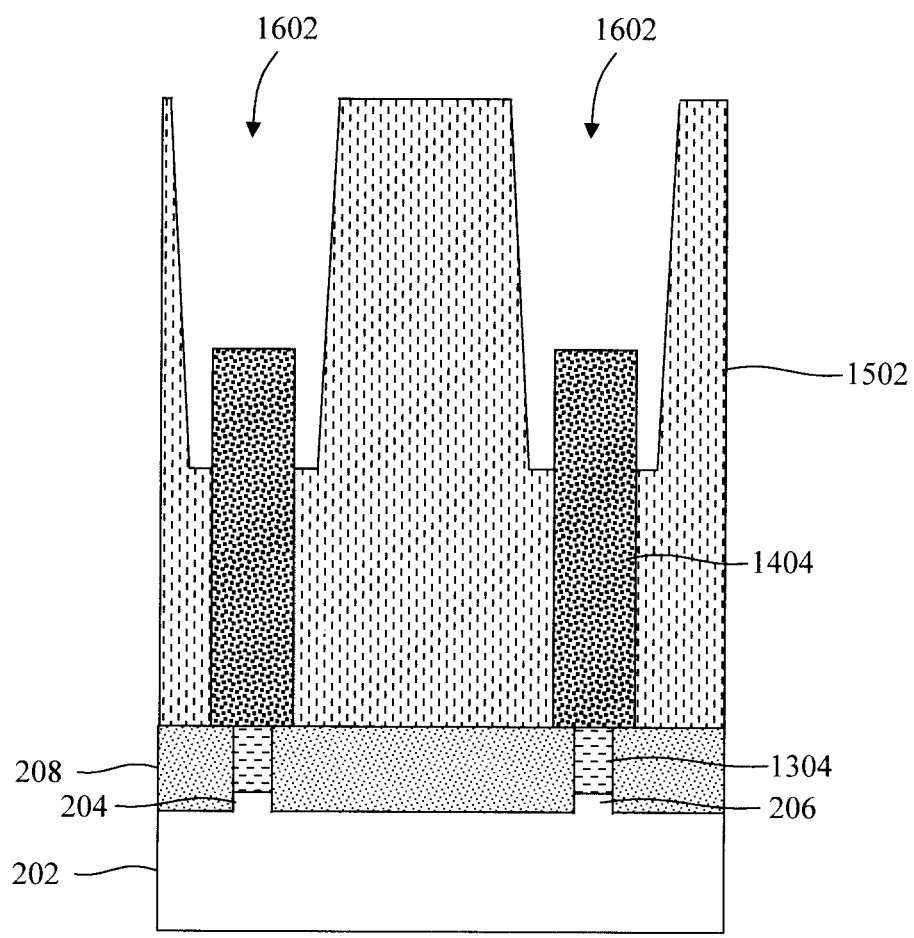
FIG. 16B is a diagram illustrating the source and drain contact trenches having been formed in the ILD over the sacrificial contacts from a cross-sectional view perpendicular to the fins in between gates according to an embodiment of the present invention.

Source and drain contact trenches 1602 are then formed in the ILD 1502 over the sacrificial contacts 1404. See FIGS. 16A and 16B. FIG. 16A provides a cross-sectional view X (see FIG. 1) through the device structure. FIG. 16B provides a cross-sectional view Y3 (see FIG. 1) through the device structure. The cross-sectional view Y1 remains unchanged from what is shown in FIG. 15B and described above. The cross-sectional view Y2 remains unchanged from what is shown in FIG. 15C and described above. Standard lithography and etching techniques can be employed to form source and drain contact trenches 1602. A directional (anisotropic) etching process such as RIE can be employed for the trench etch.

As shown in FIG. 16A, the formation of source and drain contact trenches 1602 involves removal of ILD 1502 from in between the NFET gate stacks (high-κ gate dielectric 210/first workfunction-setting metal 502/dielectric gates 1002). Although not visible in this view, it is to be understood that ILD 1502 is also removed from in between the PFET gate stacks (high-κ gate dielectric 210/second workfunction-setting metal 702/dielectric gates 1002) which appears exactly the same as shown in FIG. 16A just on the opposite fin(s). The sacrificial contacts 1404 are now exposed at the bottom of the source and drain contact trenches 1602.

As shown in FIG. 16B, outside of the gate region of the device the source and drain contact trenches 1602 are formed in ILD 1502 over, and exposing a top portion of, the sacrificial contacts 1404. As provided above, ILD 1502 can be formed from a low-κ or ultralow-κ ILD material, which can be selectively etched using a plasma-based etching process.

Figure 17A:
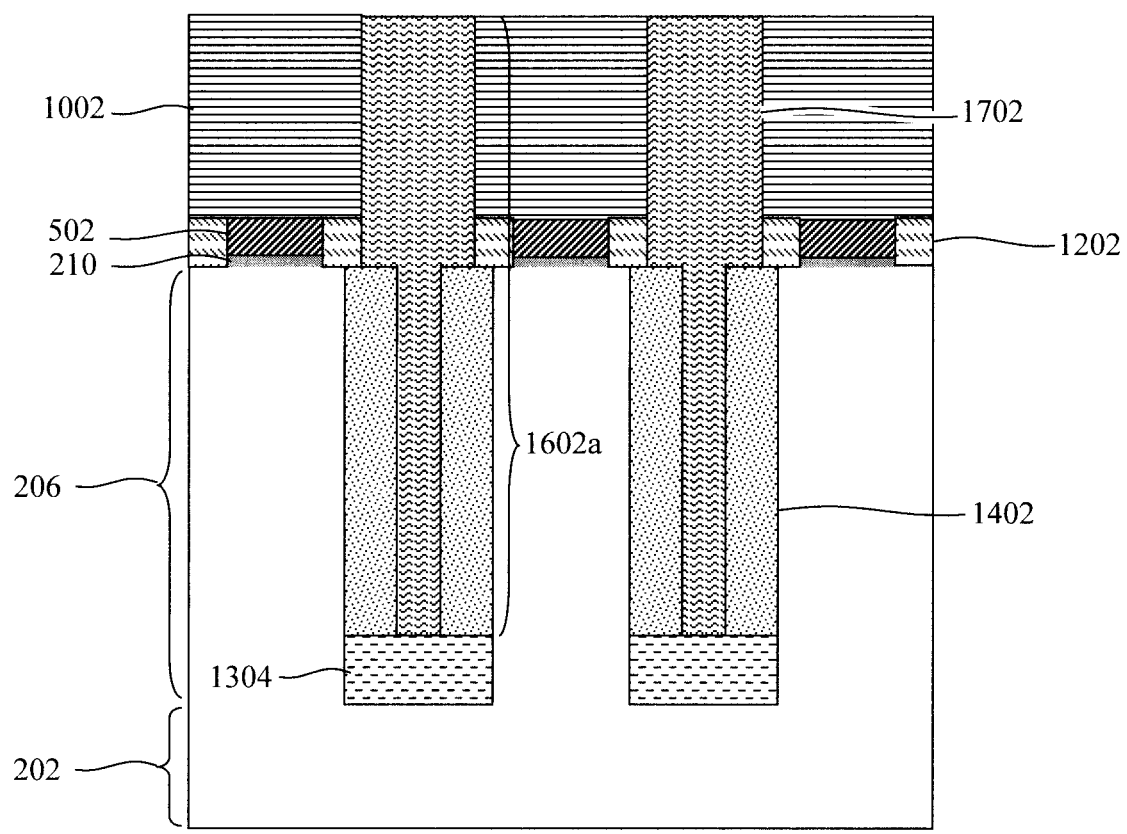
FIG. 17A is a diagram illustrating the sacrificial contacts having been removed and source and drain contact having been formed in the source and drain contact trenches from a cross-sectional view parallel to one of the fins.
Figure 17B:
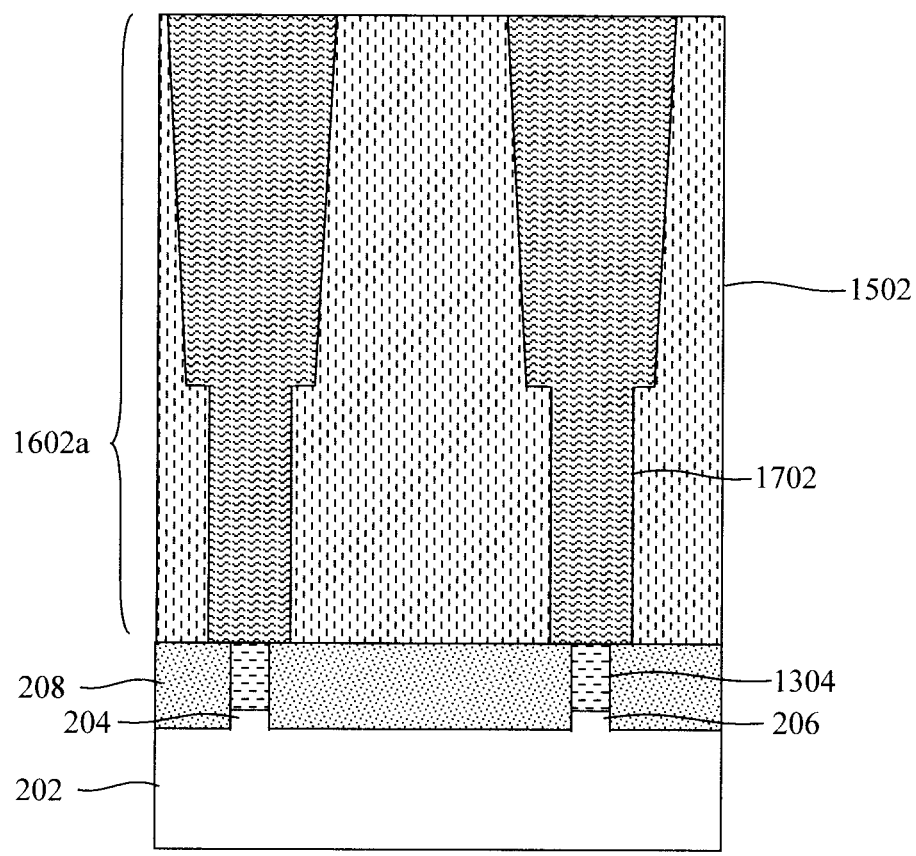
FIG. 17B is a diagram illustrating the sacrificial contacts having been removed and source and drain contact having been formed in the source and drain contact trenches from a cross-sectional view perpendicular to the fins in between gates according to an embodiment of the present invention.

Sacrificial contacts 1404, which are now accessible through the source and drain contact trenches 1602, are then selectively removed. As provided above, sacrificial contacts 1404 can be formed from a metal oxide. In that case, a plasma etching process using chlorine-containing plasma can be used to selectively etch selective sacrificial contacts 1404. Removal of the sacrificial contacts 1404 extends the source and drain contact trenches (now given reference numeral 1602a) down to the bottom isolation regions 1304, which are then filled with a contact metal(s) to form source and drain contacts 1702. See FIGS. 17A and 17B. FIG. 17A provides a cross-sectional view X (see FIG. 1) through the device structure. FIG. 17B provides a cross-sectional view Y3 (see FIG. 1) through the device structure. The cross-sectional view Y1 remains unchanged from what is shown in FIG. 15B and described above. The cross-sectional view Y2 remains unchanged from what is shown in FIG. 15C and described above.

Suitable contact metals include, but are not limited to, copper (Cu), cobalt (Co), ruthenium (Ru) and/or tungsten (W). The contact metal(s) can be deposited into the source and drain contact trenches 1602a using a process such as evaporation, sputtering or electrochemical plating. Following deposition, the metal overburden can be removed using a process such as CMP. Prior to depositing the contact metal(s) into the source and drain contact trenches 1602a, a conformal barrier layer (not shown) can be deposited into and lining the source and drain contact trenches 1602a. Use of such a barrier layer helps to prevent diffusion of the contact metal(s) into the surrounding dielectric. Suitable barrier layer materials include, but are not limited to, tantalum (Ta), tantalum nitride (TaN), titanium (Ti), and/or titanium nitride (TiN). Additionally, a seed layer (not shown) can be deposited into and lining the source and drain contact trenches 1602a prior to contact metal deposition. A seed layer facilitates plating of the contact metal into the source and drain contact trenches 1602a.

As shown in FIG. 17A, source and drain contacts 1702 are now present between (and in direct contact with) source and drains 1402, and extend down to bottom isolation regions 1304. Notably, inner spacer 1202 separates the NFET gate stacks (high-κ gate dielectric 210/first workfunction-setting metal 502/dielectric gates 1002) and PFET gate stacks (high-κ gate dielectric 210/second workfunction-setting metal 702/dielectric gates 1002) from the source and drains 1402/source and drain contacts 1702. As shown in FIG. 17B, outside of the gate region the source and drain contacts 1702 simply land on the STI regions 208 and bottom isolation regions 1304.

Figure 18:
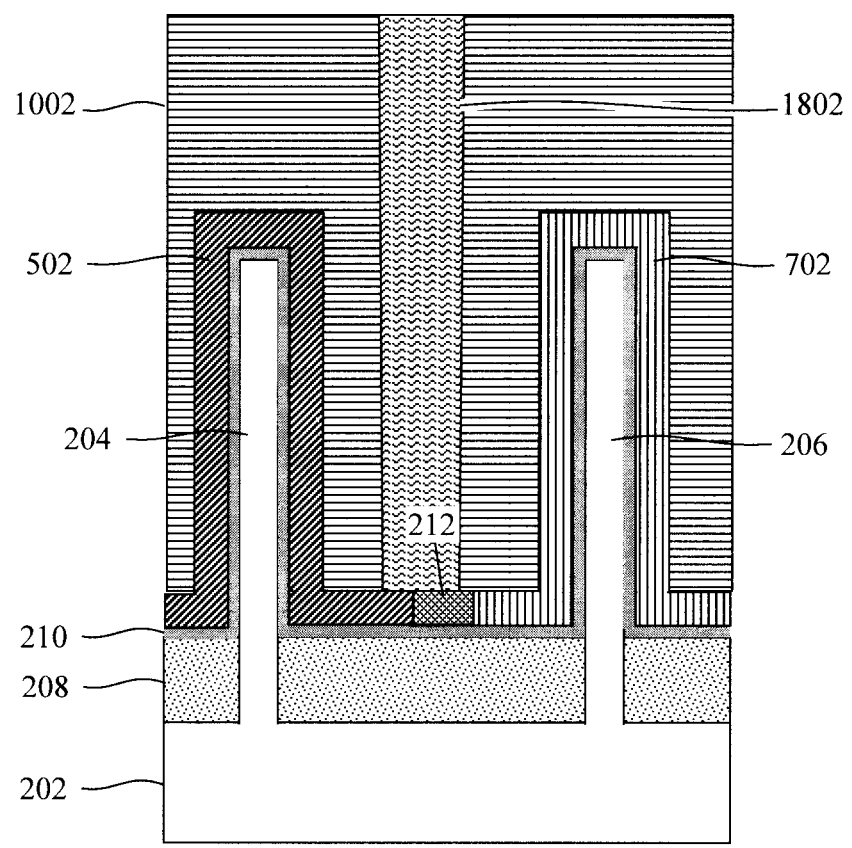
FIG. 18 is a diagram illustrating a gate contact having been formed from a cross-sectional view perpendicular to the fins through the center of one of the gates according to an embodiment of the present invention.

A gate contact 1802 is then formed. See FIG. 18. FIG. 18 provides a cross-sectional view Y1 (see FIG. 1) through the device structure. The cross-sectional view X remains unchanged from what is shown in FIG. 15A and described above. The cross-sectional view Y2 remains unchanged from what is shown in FIG. 15C and described above. The cross-sectional view Y3 remains unchanged from what is shown in FIG. 15D and described above.

To form gate contact 1802, standard lithography and etching techniques are first employed to pattern at least one contact via 1801 in the dielectric gate 1002, which is then filled with a contact metal(s) to form gate contact 1802. As provided above, suitable contact metals include, but are not limited to, Cu, Co, Ru and/or W. The contact metal(s) can be deposited into the contact via 1801 using a process such as evaporation, sputtering or electrochemical plating. Following deposition, the metal overburden can be removed using a process such as CMP. Prior to depositing the contact metal(s) into the contact via 1801, a conformal barrier layer (not shown) can be deposited into and lining the contact via 1801. Use of such a barrier layer helps to prevent diffusion of the contact metal(s) into the surrounding dielectric. As provided above, suitable barrier layer materials include, but are not limited to, Ta, TaN, Ti, and/or TiN. Additionally, a seed layer (not shown) can be deposited into and lining the contact via 1801 prior to contact metal deposition. A seed layer facilitates plating of the contact metal into the contact via 1801.

As shown in FIG. 18, gate contact 1802 extends down through the dielectric gate 1002, and is in direct contact with at least one of conformal sacrificial layer 212, first workfunction-setting metal 502 and/or second workfunction-setting metal 702. Thus, both the NFET and PFET gates can be accessed by gate contact 1802.

Figure 19:
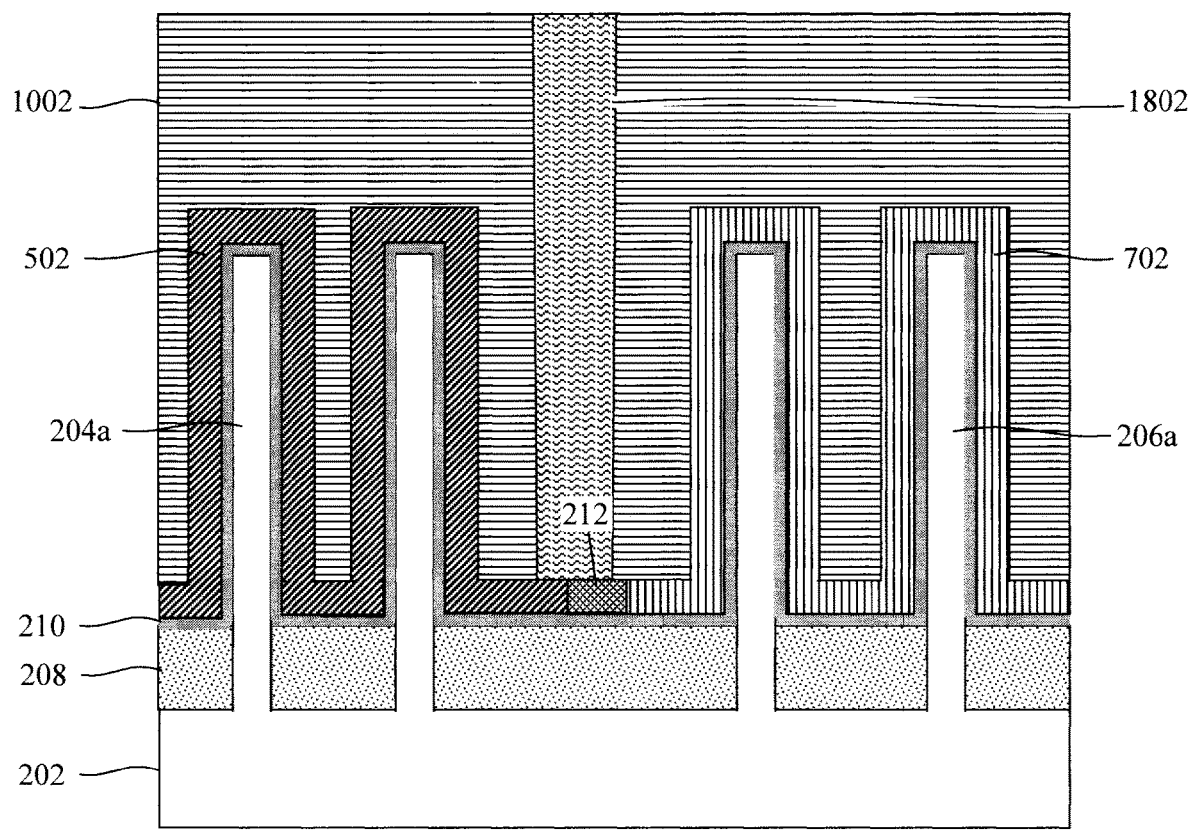
FIG. 19 is a diagram illustrating a FINFET design having multiple NFET fins and multiple PFET fins from a cross-sectional view perpendicular to the fins through the center of one of the gates according to an embodiment of the present invention.

As provided above, the illustration of a single NFET fin 204 and a single PFET fin 206 in the preceding example is done merely for ease and clarity of depiction. The same techniques can be employed in the same manner described to form a device with multiple NFET fins and/or multiple PFET fins. For instance, by way of example only, an exemplary device structure is provided in FIG. 19 having multiple NFET fins (given reference numeral 204a) and multiple PFET fins (given reference numeral 206a) formed using the above-described techniques. FIG. 19 provides a cross-sectional view Y1 (see FIG. 1) through the device structure. Like structures are numbered alike in the figures.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A fin field-effect transistor (FINFET), comprising:
   fins patterned in a substrate, wherein the fins comprise at least one first fin corresponding to a first FINFET device and at least one second fin corresponding to a second FINFET device;
   a conformal gate dielectric disposed over the fins;
   at least one first workfunction-setting metal disposed over the at least one first fin and at least one second workfunction-setting metal disposed over the at least one second fin, wherein the at least one first workfunction-setting metal and the at least one second workfunction-setting metal have the same thickness T;
   dielectric gates formed over the at least one first workfunction-setting metal, the at least one second workfunction-setting metal and the conformal gate dielectric forming gate stacks of the first FINFET device and the second FINFET device; and
   source and drains formed in the fins between the gate stacks, wherein the source and drains are separated from the gate stacks by inner spacers.

2. The FINFET of claim 1, further comprising:
   shallow trench isolation STI regions in the substrate in between the fins.

3. The FINFET of claim 1, wherein the conformal gate dielectric comprises a high-κ gate dielectric selected from the group consisting of: hafnium oxide ($HfO_2$), lanthanum oxide ($La_2O_3$), and combinations thereof.

4. The FINFET of claim 1, wherein the dielectric gates comprise a material selected from the group consisting of: silicon oxide (SiOx), silicon carbide (SiC), silicon oxycarbide (SiOC), and combinations thereof.

5. The FINFET of claim 1, wherein the inner spacers comprise a material selected from the group consisting of: SiOx, silicon oxycarbide (SiOC), silicon nitride (SiN), silicon oxynitride (SiON), silicon carbide nitride (SiCN), silicon oxycarbon nitride (SiOCN), and combinations thereof.

6. The FINFET of claim 1, wherein the same thickness T is from about 3 nm to about 10 nm.

7. The FINFET of claim 1, wherein the source and drains are formed from a doped epitaxial material.

8. The FINFET of claim 1, wherein the source and drains are disposed on bottom isolation regions.

9. The FINFET of claim 8, wherein the bottom isolation regions comprise silicon oxide (SiOx).

10. The FINFET of claim 8, wherein the bottom isolation regions have a thickness t of from about 2 nm to about 5 nm and ranges therebetween.

11. A fin field-effect transistor (FINFET), comprising:
   fins patterned in a substrate, wherein the fins comprise at least one first fin corresponding to a first FINFET device and at least one second fin corresponding to a second FINFET device, wherein the first FINFET device comprises an n-channel FET (NFET), and wherein the second FINFET device comprises a p-channel FET (PFET);
   a conformal gate dielectric disposed over the fins;
   at least one first workfunction-setting metal disposed over the at least one first fin and at least one second workfunction-setting metal disposed over the at least one second fin, wherein the at least one first workfunction-setting metal and the at least one second workfunction-setting metal have the same thickness T;
   dielectric gates formed over the at least one first workfunction-setting metal, the at least one second workfunction-setting metal and the conformal gate dielectric forming gate stacks of the first FINFET device and the second FINFET device; and
   source and drains formed in the fins between the gate stacks, wherein the source and drains are separated from the gate stacks by inner spacers.

12. The FINFET of claim 11, wherein the at least one first workfunction-setting metal is selected from the group consisting of: titanium nitride (TiN), tantalum nitride (TaN), titanium aluminide (TiAl), titanium aluminum nitride (TiAlN), titanium aluminum carbide (TiAlC), tantalum aluminide (TaAl), tantalum aluminum nitride (TaAlN), tantalum aluminum carbide (TaAlC), and combinations thereof.

13. The FINFET of claim 11, wherein the at least one second workfunction-setting metal is selected from the group consisting of: TiN, TaN, tungsten (W), and combinations thereof.

14. The FINFET of claim 11, further comprising:
   shallow trench isolation STI regions in the substrate in between the fins.

15. The FINFET of claim 11, wherein the conformal gate dielectric comprises a high-κ gate dielectric selected from the group consisting of: hafnium oxide ($HfO_2$), lanthanum oxide ($La_2O_3$), and combinations thereof.

16. The FINFET of claim 11, wherein the dielectric gates comprise a material selected from the group consisting of: silicon oxide (SiOx), silicon carbide (SiC), silicon oxycarbide (SiOC), and combinations thereof.

17. The FINFET of claim 11, wherein the inner spacers comprise a material selected from the group consisting of: SiOx, silicon oxycarbide (SiOC), silicon nitride (SiN), silicon oxynitride (SiON), silicon carbide nitride (SiCN), silicon oxycarbon nitride (SiOCN), and combinations thereof.

18. The FINFET of claim 11, wherein the same thickness T is from about 3 nm to about 10 nm.

19. The FINFET of claim 11, wherein the source and drains are disposed on bottom isolation regions.

20. The FINFET of claim 11, wherein the bottom isolation regions comprise silicon oxide (SiOx) having a thickness t of from about 2 nm to about 5 nm and ranges therebetween.

* * * * *